(12) United States Patent
Huang et al.

(10) Patent No.: US 12,020,986 B2
(45) Date of Patent: *Jun. 25, 2024

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Yuan-Sheng Huang, Taichung (TW); Ryan Chia-Jen Chen, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/814,858

(22) Filed: Jul. 26, 2022

(65) Prior Publication Data
US 2022/0359300 A1 Nov. 10, 2022

Related U.S. Application Data

(63) Continuation of application No. 17/008,098, filed on Aug. 31, 2020, now Pat. No. 11,404,321.

(51) Int. Cl.
*H01L 29/76* (2006.01)
*H01L 21/8234* (2006.01)
*H01L 27/088* (2006.01)
*H01L 29/06* (2006.01)
*H01L 29/66* (2006.01)
*H01L 29/94* (2006.01)

(52) U.S. Cl.
CPC .. *H01L 21/823431* (2013.01); *H01L 27/0886* (2013.01); *H01L 29/0649* (2013.01); *H01L 29/66545* (2013.01)

(58) Field of Classification Search
CPC ......... H01L 21/823431; H01L 27/0886; H01L 29/0649; H01L 29/66545; H01L 29/66795
USPC .......................................................... 257/288
See application file for complete search history.

(56) References Cited

U.S. PATENT DOCUMENTS 11,404,321 B2 * 8/2022 Huang .............. H01L 29/66795

* cited by examiner

*Primary Examiner* — Theresa T Doan
(74) *Attorney, Agent, or Firm* — WPAT LAW; Anthony King

(57) ABSTRACT

A semiconductor structure and method of manufacturing a semiconductor structure are provided. The method includes receiving a substrate with fin features; forming a first gate stack over the substrate, wherein the first gate stack comprise at least one void exposed from a surface of the first gate stack; forming a fill material in the at least one void; partially removing the fill material outside the at least one void, wherein a portion of the fill material is left in the at least one void; forming sidewall spacers besides the first gate stack; removing the first gate stack; and forming a second gate stack.

20 Claims, 23 Drawing Sheets

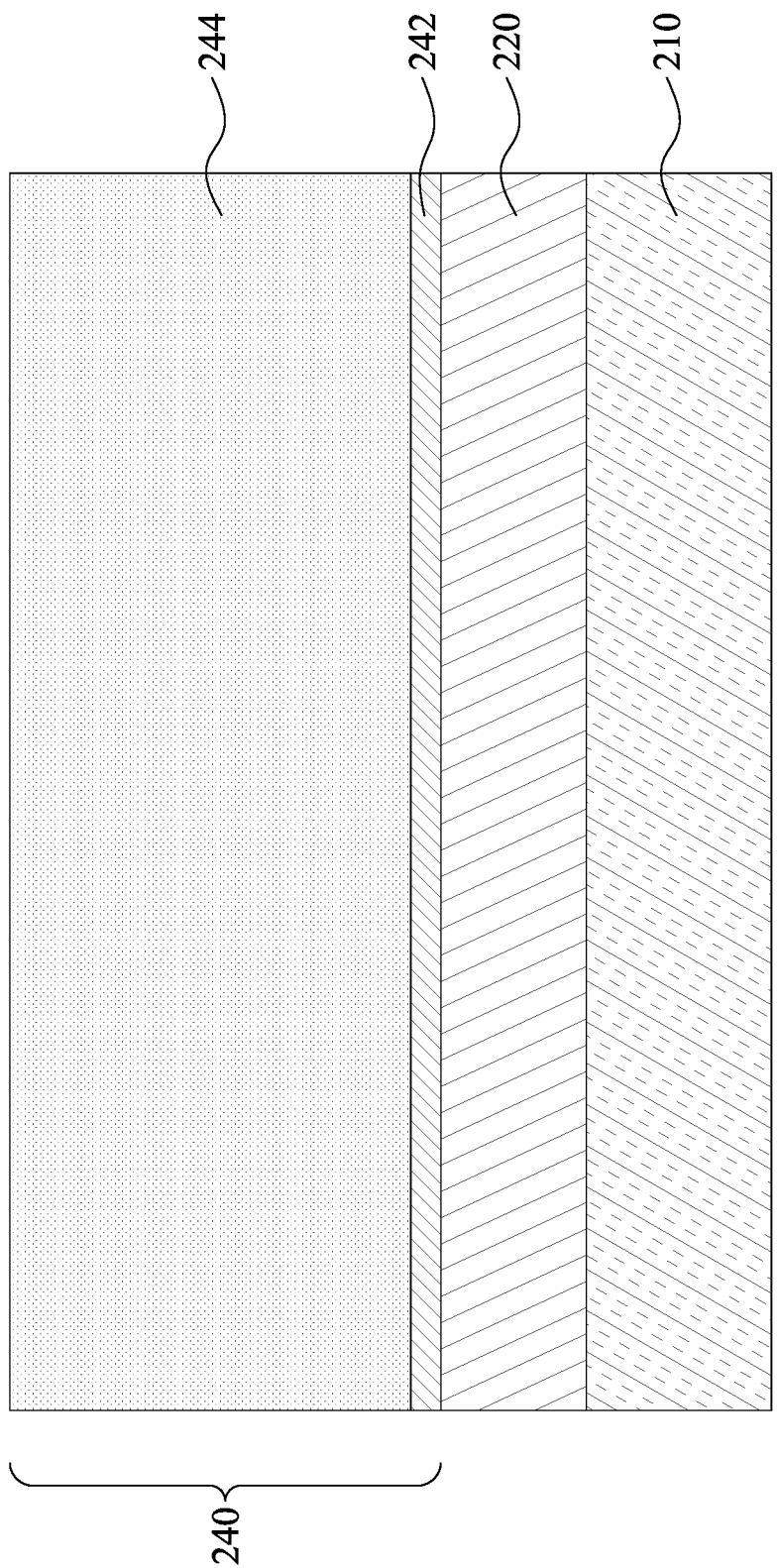

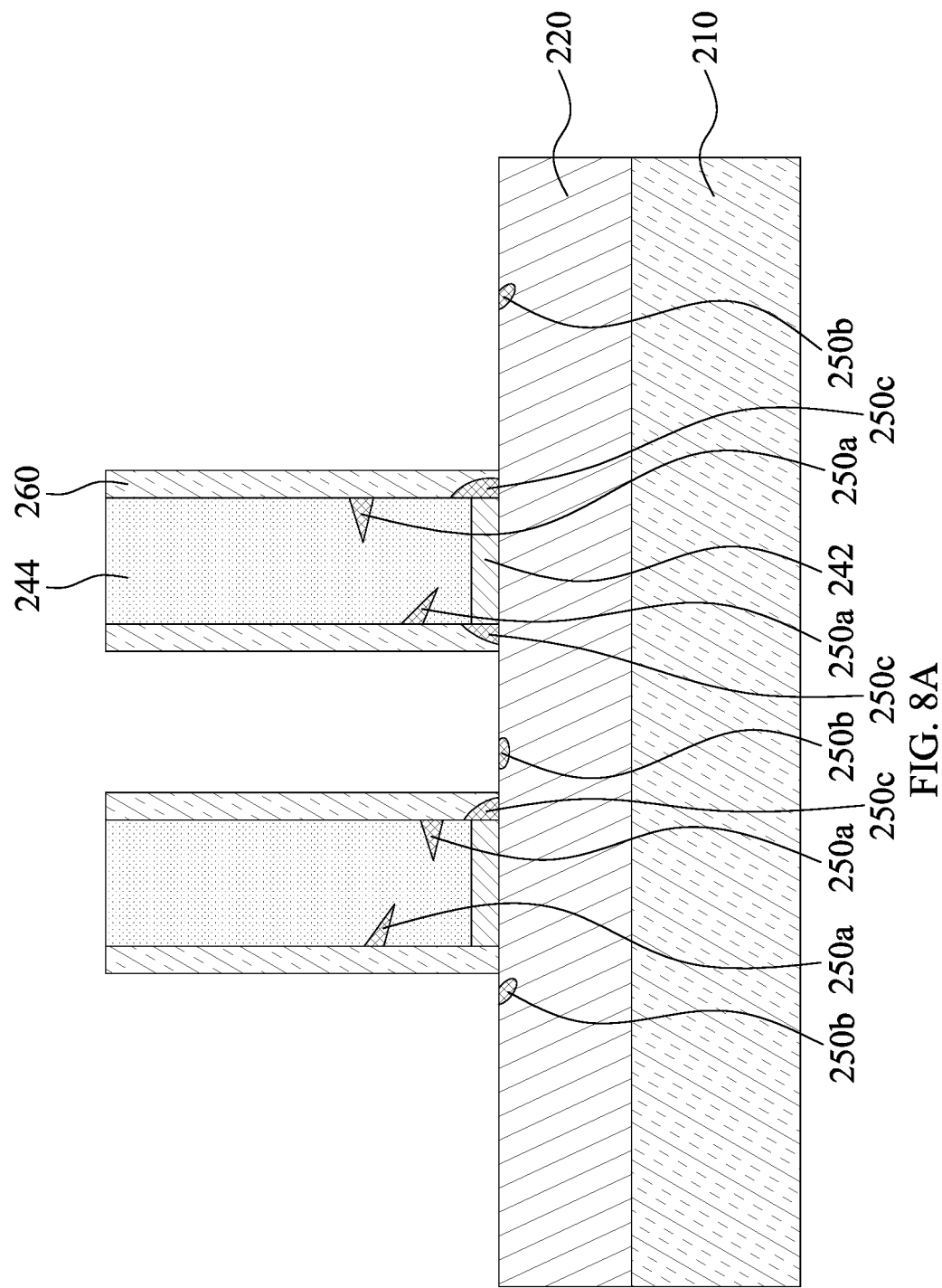

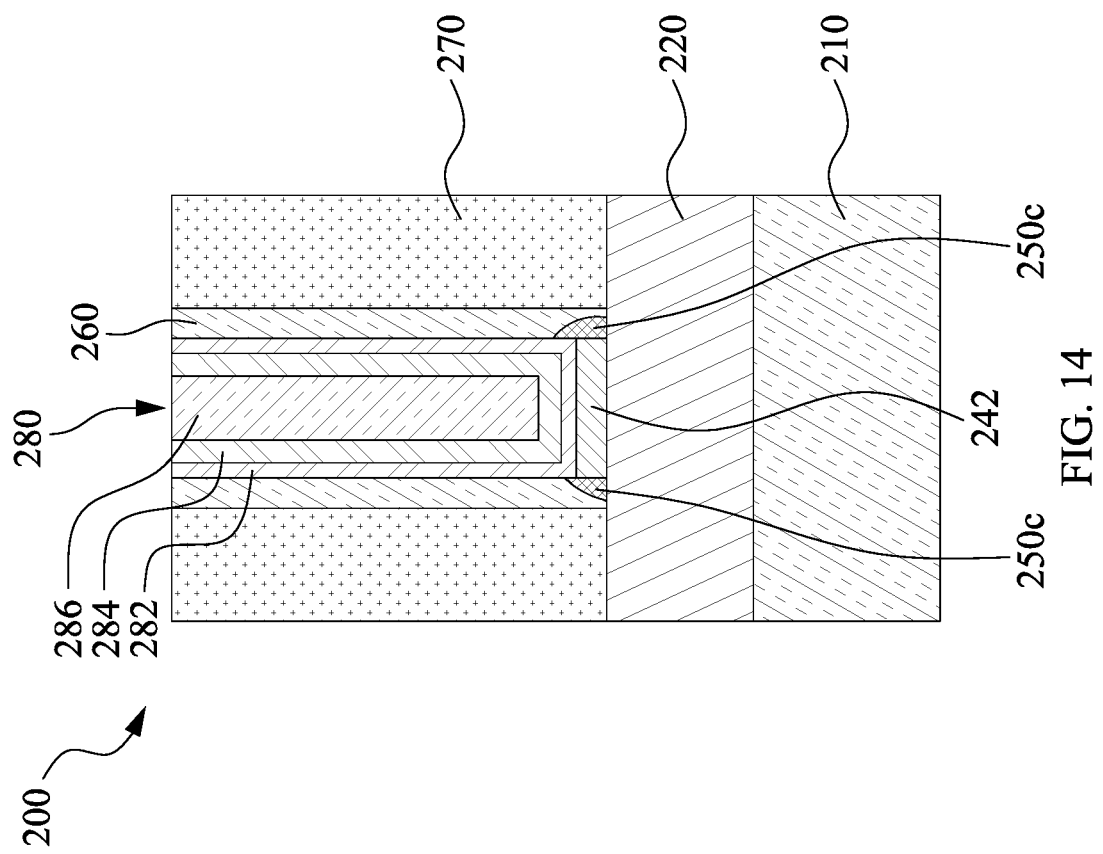

SEMICONDUCTOR STRUCTURE AND METHOD OF MANUFACTURING THE SAME

PRIORITY CLAIM AND CROSS-REFERENCE

This application is a continuity application and claims the benefit of U.S. non-provisional application Ser. No. 17/008,098 filed Aug. 31, 2020, the disclosures of which are hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, forming a three dimension strained channel raises challenges in a FinFET process development. It is desired to have improvements in this area.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A and 11A illustrate cross-sectional views of the semiconductor structure along line A-A in FIG. 2 at various stages of fabrication according to the method of FIG. 1.

FIG. 14 is a cross-sectional view of the semiconductor structure along line IMP in FIG. 12.

DETAILED DESCRIPTION OF THE DISCLOSURE

Figure 1:
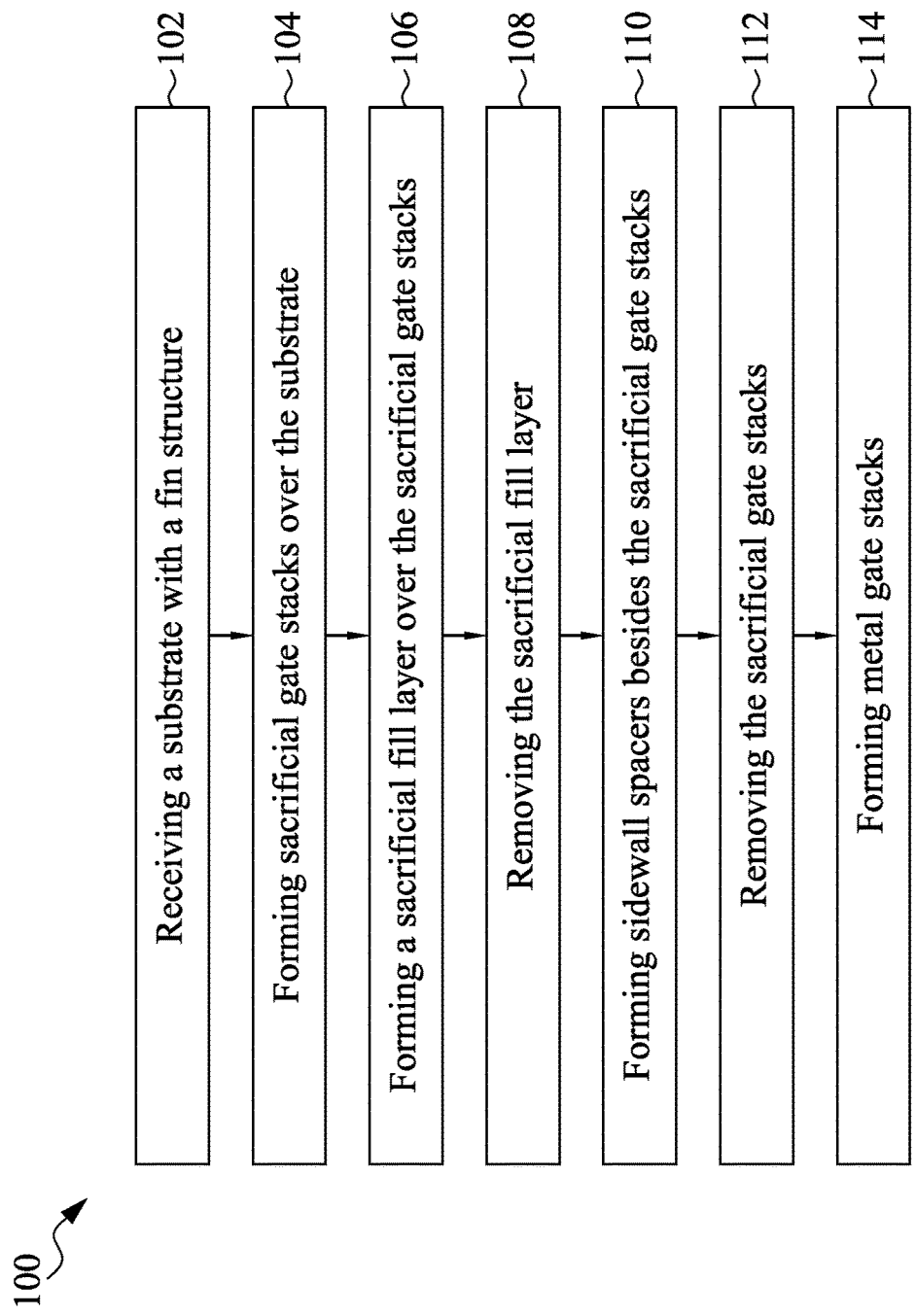
FIG. 1 is a flow chart of a method for fabricating a semiconductor structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

When forming a metal gate structure, in some embodiments, a sacrificial layer is formed over a substrate and patterned using a photolithography process. Spacers are formed alongside the patterned sacrificial layer using a self-aligned process. The sacrificial layer is then removed and is replaced by a metal gate, and the remaining spacers may then be used to pattern the metal gate. In general, the sacrificial layer is formed over the substrate using PVD, CND or other suitable deposition methods. Sometimes, the sacrificial layer may not be uniformly deposited over the substrate due to the fin profile, such as the increase of fin aspect ratio, narrow fin pitch and so on and thus voids may be formed in the sacrificial layer. When spacers are formed alongside the patterned sacrificial layer, the voids may be filled with the material of spacers. The material filled in the voids is retained and protrudes from the sidewalls of the spacers after the sacrificial layer is removed, which hinders the formation of the metal gate.

Figure 2:
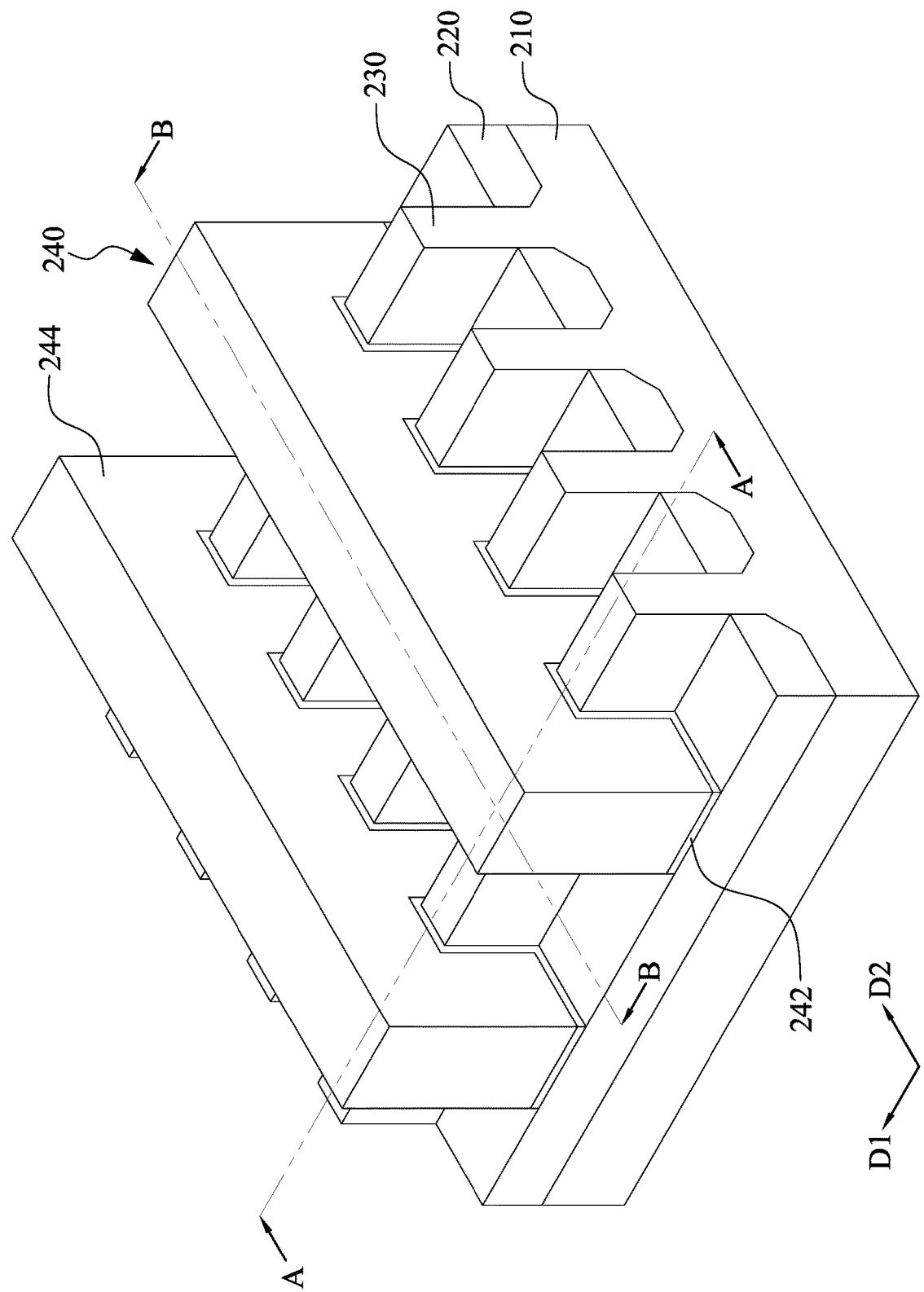
FIG. 2 is a perspective view of the semiconductor structure with sacrificial gate stacks according to various aspects of the present disclosure.

FIG. 1 is a flowchart of a method 100 for fabricating a semiconductor structure according to aspects of the present disclosure, including operations 102, 104, 106, 108, 110, 112 and 114. FIG. 2 is a perspective view of a semiconductor structure with sacrificial gate stacks, manufactured according to the operations 102 and 104 of the method of FIG. 1. FIGS. 3 to 11 illustrate cross-sectional views at various stages of fabrication according to the method of FIG. 1, in which FIGS. 3A, 4A, 5A, 6A, 7A, 8A, 9A, 10A and 11A are cross-sectional views along the line A-A of FIG. 2 and FIGS. 3B, 4B, 5B, 6B, 7B, 8B, 9B, 10B and 11B are cross-sectional views along the line B-B of FIG. 2 and perpendicular to the direction of the line of A-A. FIG. 2 is a perspective view of a semiconductor structure with metal gate stacks, labeled with the reference numeral 200, manufactured according to the method of FIG. 1. FIGS. 13 and 14 are cross-sectional views of the semiconductor structure along line I-I' and line II-II', respectively, in FIG. 12.

It is understood that additional steps can be provided before, during, and after the method, and some of the steps described can be replaced or eliminated for other embodiments of the method. It is understood that parts of method 100 and/or the semiconductor structure 200 may be fabricated by a well-known complementary metal-oxide-semiconductor (CMOS) technology process flow, and thus some processes are only briefly described herein. Further, the semiconductor structure may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor structure includes a plurality of semiconductor devices (e.g., transistors), which may be interconnected.

In some embodiments, the semiconductor structure of the present invention includes any fin-based device, including double-gate field effect transistor, tri-gate field effect transistor (TGFET), multi-gate field-effect transistor (MuGFET). Semiconductor structure may be included in a microprocessor, memory cell, and/or other integrated circuit device. The drawings presented in the present invention have been simplified for the sake of clarity to better understand the inventive concepts of the present disclosure. Additional features can be added in the semiconductor structure, and some of the features described below can be replaced or eliminated in other embodiments of the semiconductor structure.

Figure 3A:
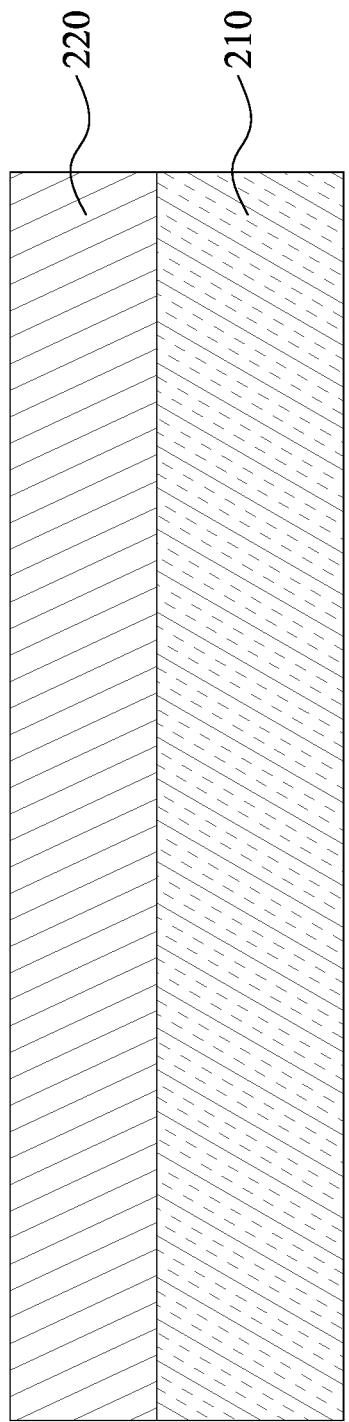
Figure 3B:
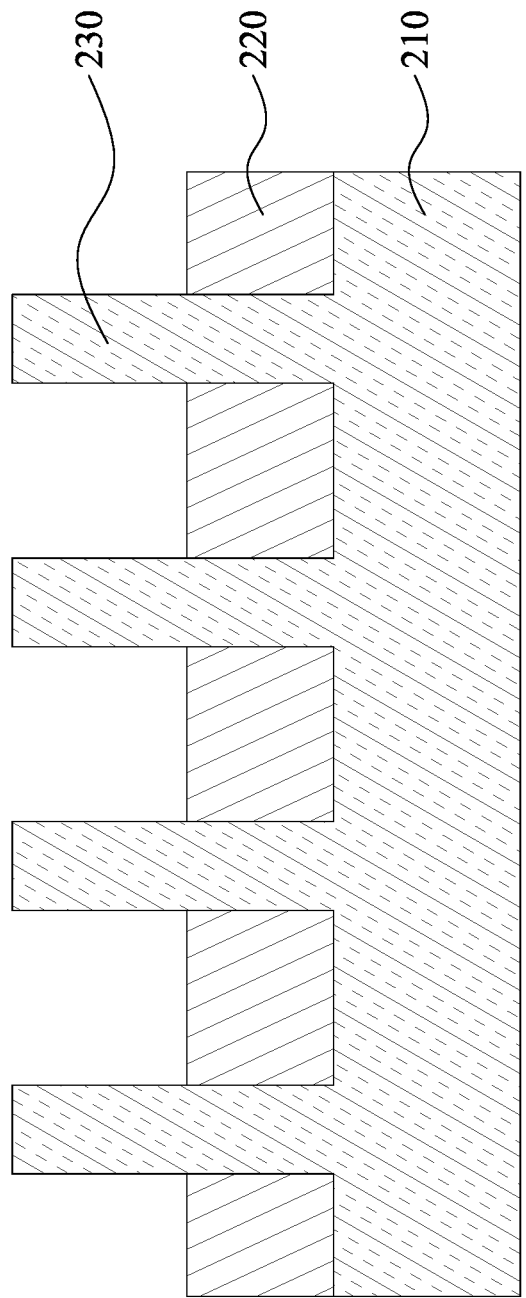
FIGS. 3B, 4B, 5B, 6B, 7B, 8B, 9B, 10B and 11B illustrate cross-sectional views of the semiconductor structure along line B-B in FIG. 2 at various stages of fabrication according to the method of FIG. 1.

Referring to FIGS. 1 and 2, method 100 for forming the semiconductor structure beings from operation 102 to operation 114. As shown in FIGS. 3A and 3B, method 100 begins at operation 102 by receiving or providing a substrate 210 with fin features 230 extending along a first direction D1. The substrate 210 may be a bulk silicon substrate. The substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In some embodiments, the substrate 210 includes a silicon-on-insulator (SOI) substrate. The SOI substrate may be fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some examples, the insulator layer is a component (e.g., layer) of a silicon-on-insulator substrate.

Various doped regions may be formed on the substrate 210. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The fin features 230 may be patterned by any suitable method. For example, the fin features 230 may be patterned using one or more photolithography processes, including double-patterning or multi-patterning processes. For example, double-patterning or multi-patterning processes combine photolithography and self-aligned processes, allowing patterns to be created that have, for example, pitches smaller than what is otherwise obtainable using a single, direct photolithography process.

The height and width of the fin structure 230 may be chosen based on device performance considerations. In some embodiments, each of the fin features 230 may have a width in a range from about 1 nm to about 50 nm. In some embodiments, each of the fin features 230 has a width in a range from about 1 nm to about 10 nm. Each of the fin features 230 may have a height in a range from about 10 nm to about 100 nm. In some embodiments, each of the fin features 230 may have a height in a range from about 30 nm to about 80 nm. The pitch of the fin features 230 may be in a range from about 1 nm to about 100 nm. In some embodiments, the pitch of the fin features 230 may be in a range from about 5 nm to about 50 nm.

Isolation regions 220 may be formed on the substrate 210 to isolate active regions of the substrate 210, The isolation region 220 may be formed using traditional isolation technology, such as shallow trench isolation (STI), to define and electrically isolate the various regions. In some embodiments, a lower portion of the fin features 230 is surrounded by the isolation structure 220, and an upper portion of the fin features 230 protrudes from the isolation regions 220, as shown in FIG. 3A. In other words, a portion of the fin features 230 is embedded in the isolation regions 220. The isolation regions 220 may alleviate electrical interference or crosstalk. The isolation region 220 comprises silicon oxide, silicon nitride, silicon oxynitride, an air gap, other suitable materials, or combinations thereof. The isolation region 220 is formed by any suitable process. As one example, the formation of an STI includes a photolithography process, an etch process to etch a trench in the substrate 210 (for example, by using a dry etching and/or wet etching), and a deposition to fill in the trench (for example, by using a chemical vapor deposition process) with one or more dielectric materials. In some examples, the filled trench may have a multi-layer structure such as a thermal oxide liner layer filled with silicon nitride or silicon oxide. In the present embodiment, where the substrate 210 remaining between trenches forms fin features 230 and the fin features 230 are separated by the isolation regions 220.

Figure 4B:
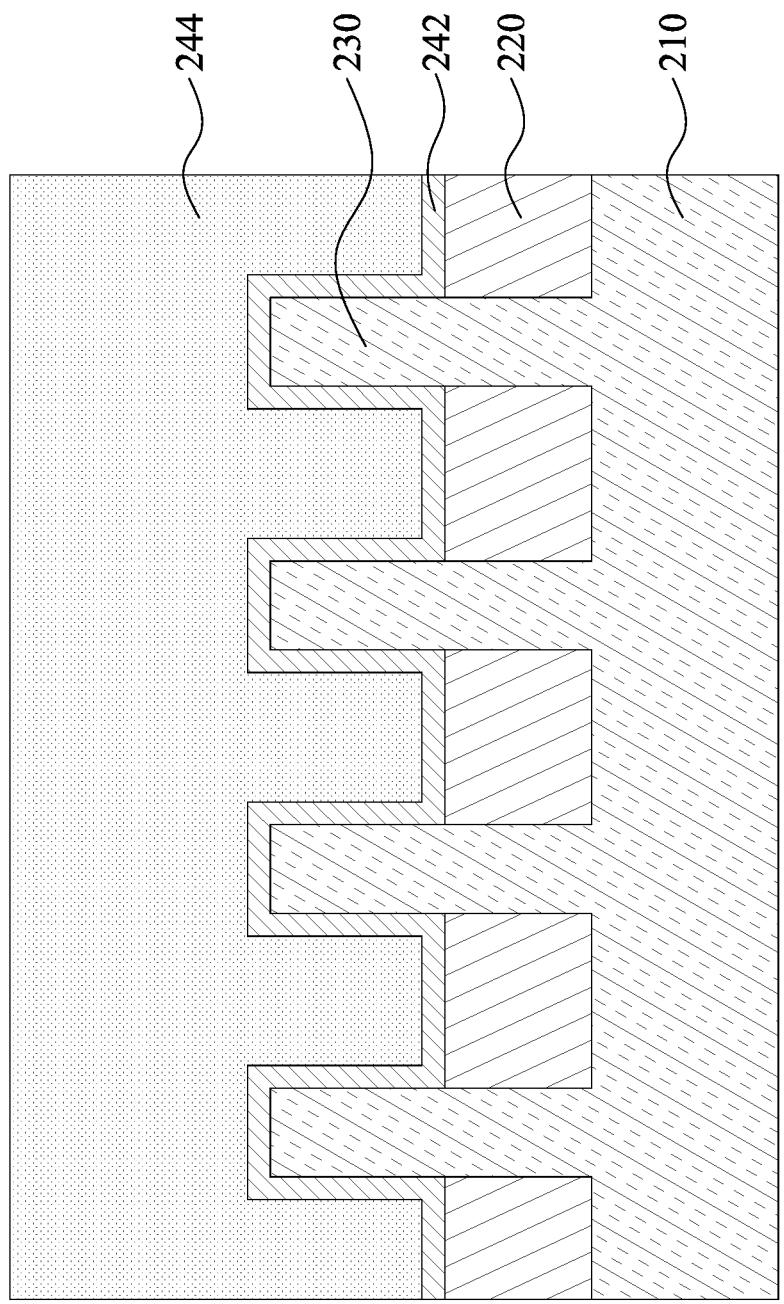

With reference to FIGS. 4A and 4B, the method 100 continues with operation 104 where one or more sacrificial gate stacks 240 are formed over the substrate 210, including over a portion of the fin features 230. The sacrificial gate stacks 240 are to be replaced later by a high-k (HK) and metal gate (MG) after high thermal temperature processes are performed, such as thermal processes during sources/drains formation. In some embodiments, a dielectric layer 242 may be formed prior to the formation of a semiconductor layer 244, so the dielectric layer 242 is sandwiched between the substrate 210 and the semiconductor layer 244. The dielectric layer 242 may be configured as an interfacial layer. In some embodiments, the dielectric layer 242 may be, but not limited to, removed. In some embodiments, the dielectric layer 242 includes silicon oxide, silicon nitride, or any other suitable materials. The semiconductor layer 244 is made of polysilicon, but the disclosure is not limited thereto.

The sacrificial gate stacks 240 extend along a second direction D2 different from the first direction D1 as shown in FIG. 2. Additionally, the first direction D1 and the second direction D2 are in the same horizontal plane. The sacrificial gate stacks 240 cover a portion of the fin features 230. In other words, the sacrificial gate stacks 240 are at least partially disposed over the fin features 230, and the portion of the fin features 230 underlying the sacrificial gate stacks 240 may be referred to as the channel region. The sacrificial gate stacks 240 may also define a source/drain region (not shown) of the fin features 230, for example, as portions of the fin features 230 adjacent to and on opposing sides of the channel region.

For example, the sacrificial gate stacks 240 can be formed by a procedure including deposition, photolithography patterning, and etching processes. The deposition processes include chemical vapor deposition (CVD), physical vapor deposition (PVD), atomic layer deposition (ALD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching).

Figure 5A:
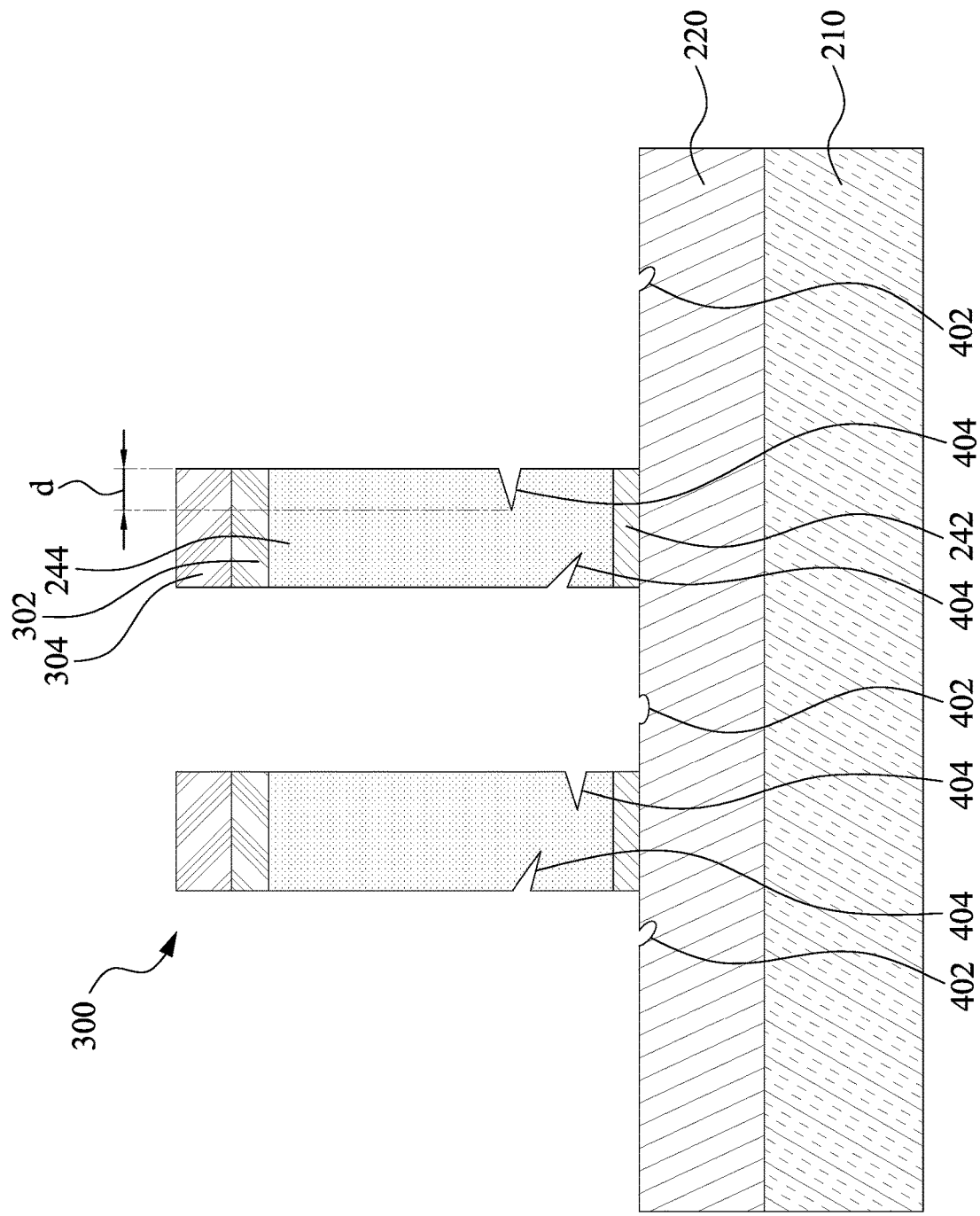
Figure 5B:
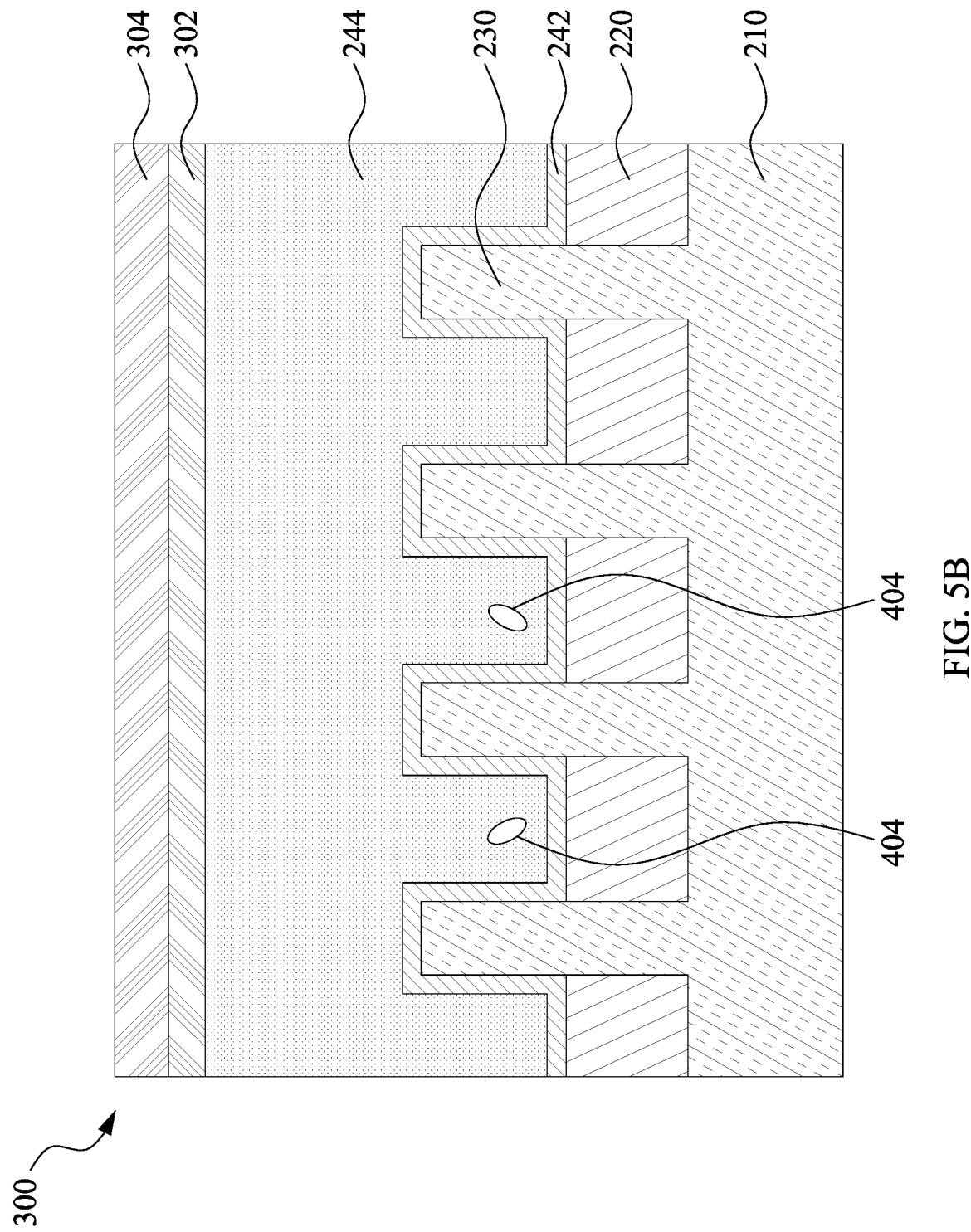

As shown in FIGS. 5A and 5B, the semiconductor layer 244 and the dielectric layer 242 are defined according to a predetermined pattern. In some embodiments, a mask 300 can be formed over the semiconductor layer 244 for defining a location and a dimension of the sacrificial gate stacks 240. The mask 300 may be a multi-layered mask including a first mask layer 302 and a second mask layer 304. In some embodiments, the first mask layer 302 may be applied onto the semiconductor layer 244 with any suitable thickness. The first mask layer 302 may include silicon oxide (such as $SiO_2$), silicon nitride (such as $Si_3N_4$), silicon oxynitride, silicon carbide, metal oxide (such as $HfO_2$, $ZrO_2$) and/or other suitable materials. The first mask layer 302 may be formed using methods such as CVD or PVD. In some embodiments, the second mask layer 304 may include silicon oxide (such as $SiO_2$), silicon nitride (such as $Si_3N_4$), silicon oxynitride, silicon carbide, metal oxide (such as $HfO_2$, $ZrO_2$) and/or other suitable materials. The first mask layer 302 may be formed using methods such as CVD or PVD. In some other embodiments, the second mask layer 304 may include photoresist, and can be applied onto the first mask layer 302 by, for example, spin coating.

During the deposition of the gate stack 240, voids 404 may be formed in the semiconductor layer 244 due to high fin aspect ratio. After the semiconductor layer 244 and the dielectric layer 242 are defined, some of the voids 404 may be exposed from the surface of the semiconductor layer 244. In some embodiments, the voids 404 may be formed in the surface of the semiconductor layer 244 at a location near the dielectric layer 242. The voids 404 may be formed in a bottom region of the semiconductor layer 244. The bottom region is below about 60% of the thickness of the semiconductor layer 244. In some embodiments, the bottom region is below about 50% of the thickness of the semiconductor layer 244. In some embodiments, the bottom region is below about 40% of the thickness of the semiconductor layer 244. In some embodiments, each of the voids 246 exposed from the dielectric layer 242 may have a depth d in a range from about 1 Å to about 5 nm. In some embodiments, the voids formed on the surface may have a depth d in a range from about 10 Å to about 1 nm. In some embodiments, each of the voids 404 formed on the surface may have a depth d in a range from about 50 Å to about 500 Å. The voids 404 may be exposed in various shapes, such as pyramid, hemisphere or other regular or irregular shapes.

After the semiconductor layer 244 and the dielectric layer 242 are defined, in some embodiments, recesses 402 may be formed in the surface of the isolation regions 220 due to the etching process. The recesses 402 may have an average diameter ranging from about 10 Å to about 15 nm. In some embodiments, the recesses 402 may have an average diameter ranging from about 100 Å to about 5 nm. In some embodiments, the recesses 402 may have an average diameter ranging from about 500 Å to about 1 nm. The recesses 402 may have various shapes, such as pyramid, hemisphere or other regular or irregular shapes.

Figure 6A:
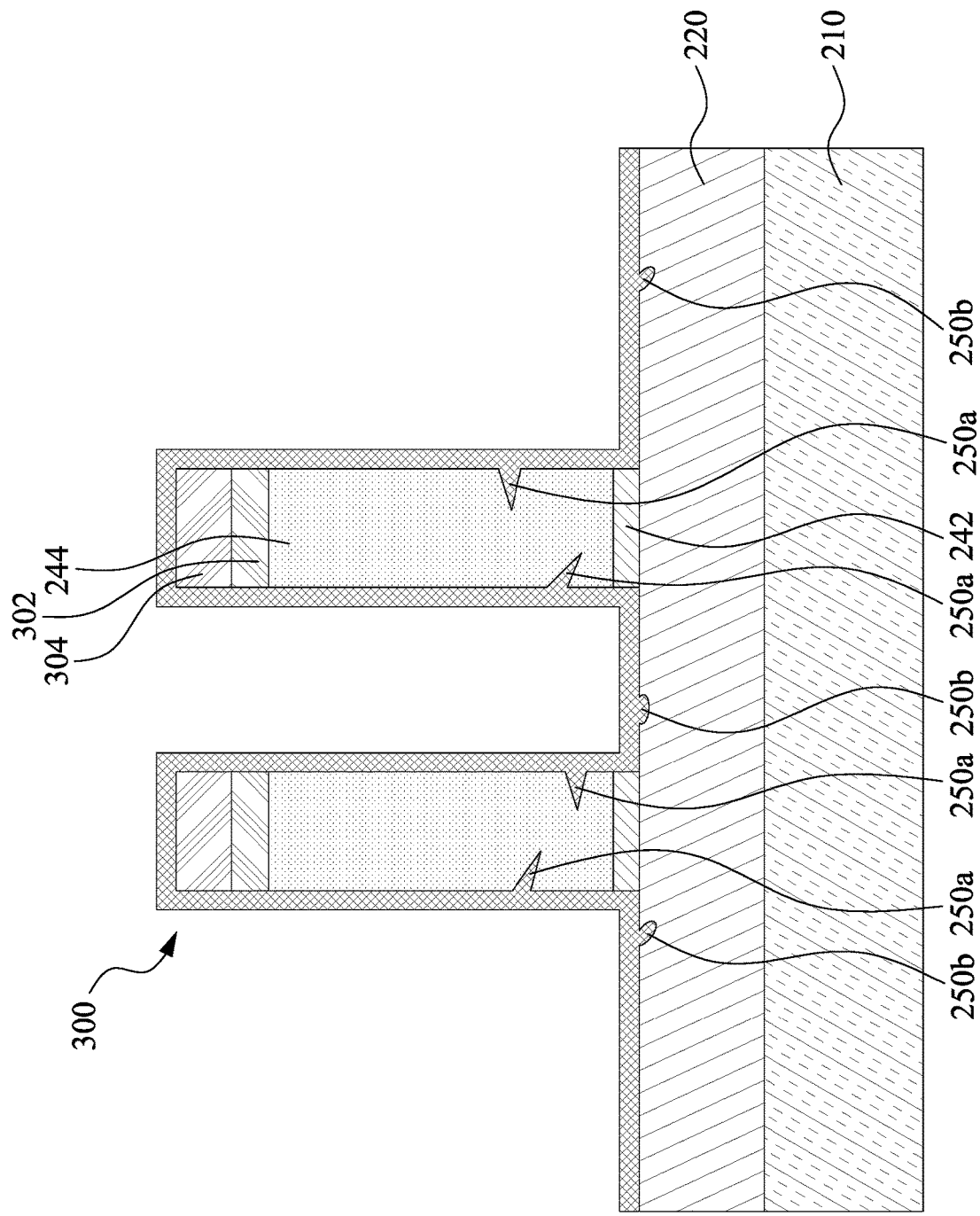
Figure 6B:
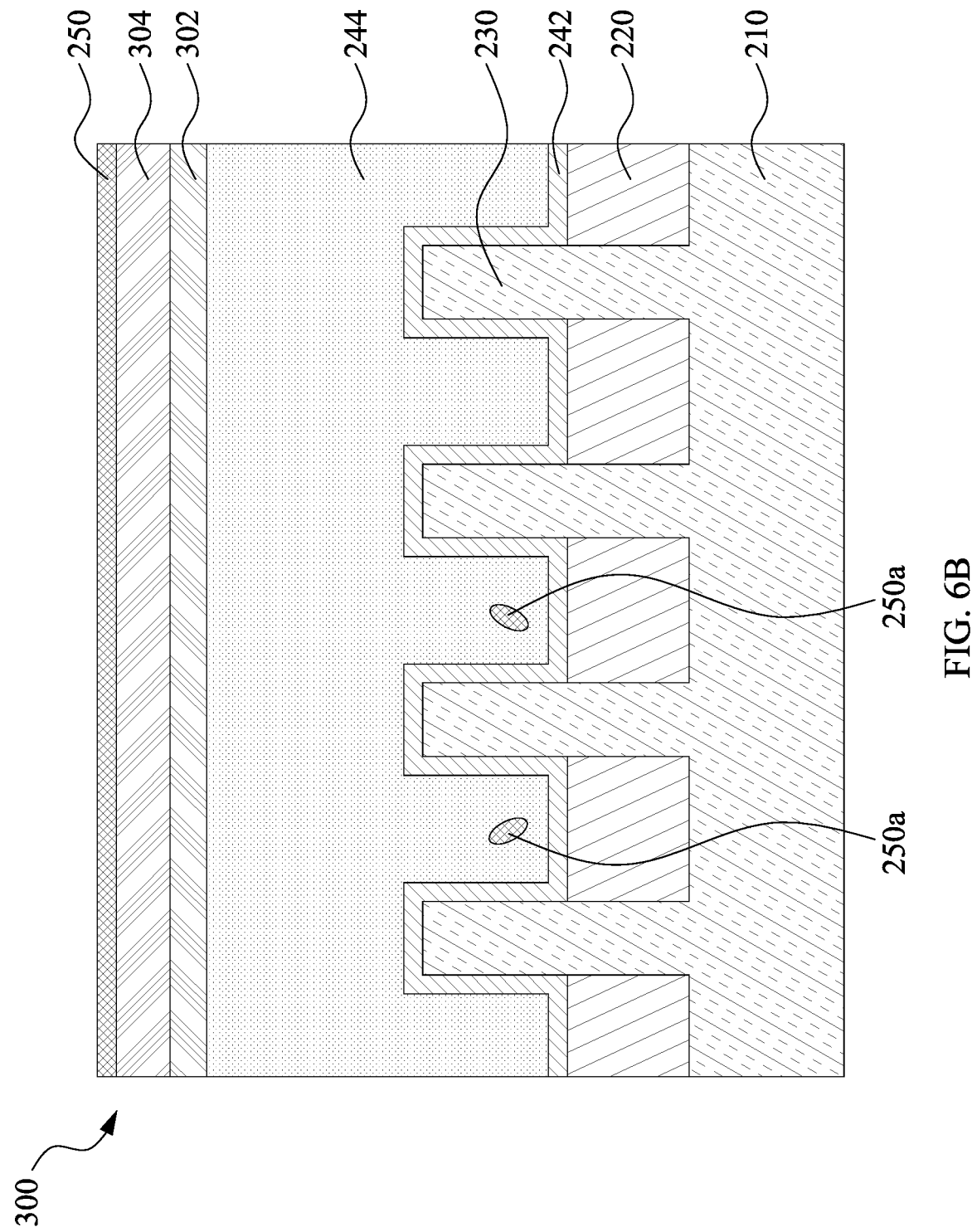

At operation 106, with reference to FIGS. 6A and 6B, a sacrificial fill layer 250 is formed over the sacrificial gate stacks 240 and on the exposed isolation regions 220, so as to fill the voids 404 formed in the surface of the semiconductor layer 244 and/or fill the recesses 402 formed in the surface of the isolation regions 220. In some embodiments, the first mask layer 302 and the second mask layer 304 are still remained on the semiconductor layer 244 and thus the sacrificial fill layer 250 is formed over the top of the second mask layer 304 and along sides of the second mask layer 304, the first mask layer 302 and the sacrificial gate stacks 240. The sacrificial fill layer 250 has a thickness in a range from few angstroms to few nanometers. In some embodiments, the sacrificial fill layer 250 has a thickness in a range from about 1.0 Å to about 1 nm. In some embodiments, the sacrificial fill layer 250 has a thickness in a range from about 1.0 Å to about 500 Å. In some embodiments, the sacrificial fill layer 250 has a thickness in a range from about 1.0 Å to about 50 Å. The sacrificial fill layer 250 is made of fill materials with high etch rate selectivity to materials for forming sidewall spacers 260 mentioned below. The fill materials for forming the sacrificial fill layer 250 is removable during the removal of the sacrificial gate stacks and may include, but not limited to, silicon (Si), silicon germanium (SiGe), silicon carbide (SiC), carbon, metallic compounds, high-k dielectric material, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, or combinations thereof. Methods for forming the sacrificial fill layer 250 may include depositing the aforementioned material over the sacrificial gate stack 240 by, fir example, PVD, CVD or ALD, and then anisotropically etching back the material. The etching back process may include a multiple-step etching to gain etch selectivity, flexibility and desired overetch control.

Figure 7A:
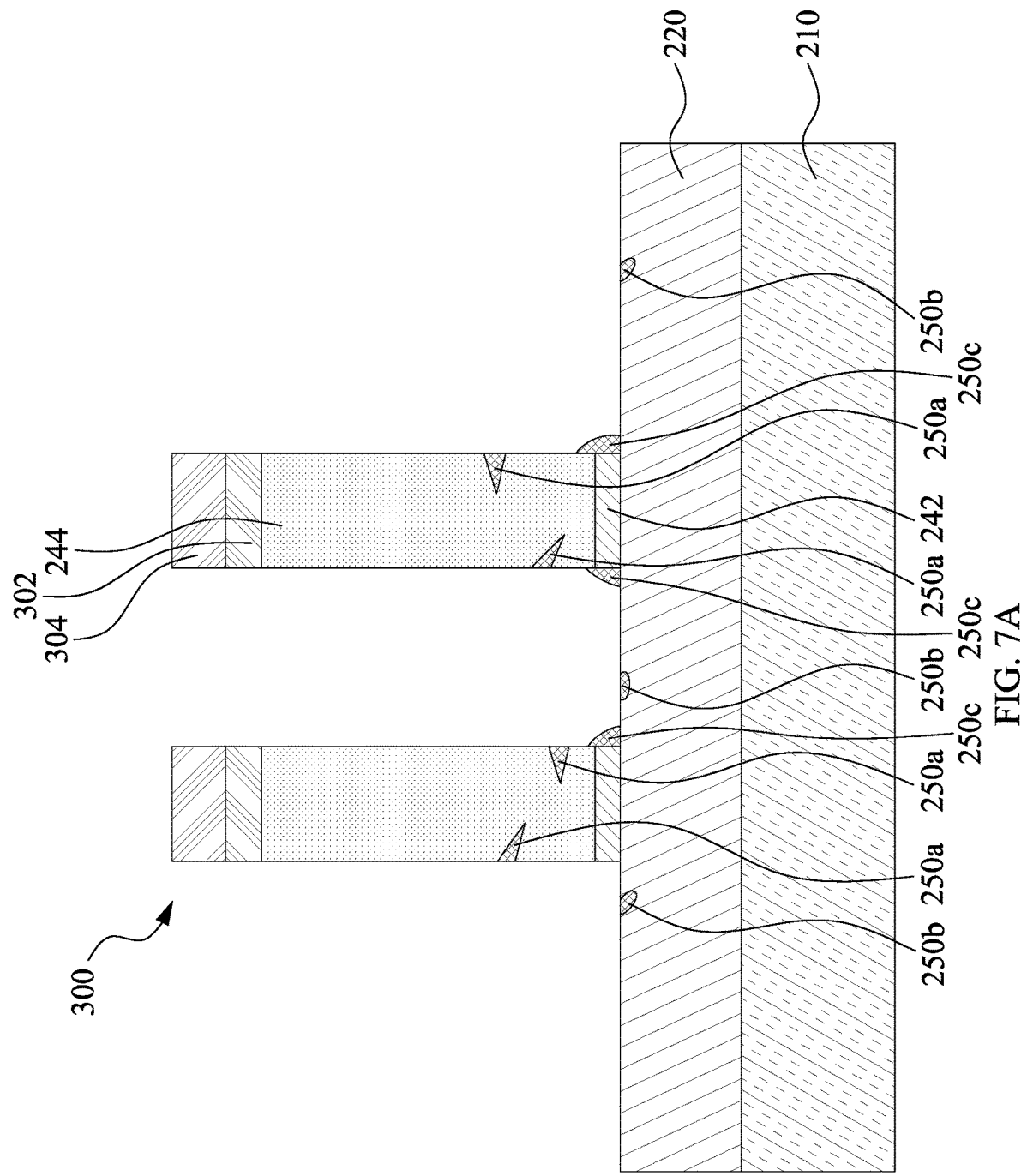
Figure 7B:
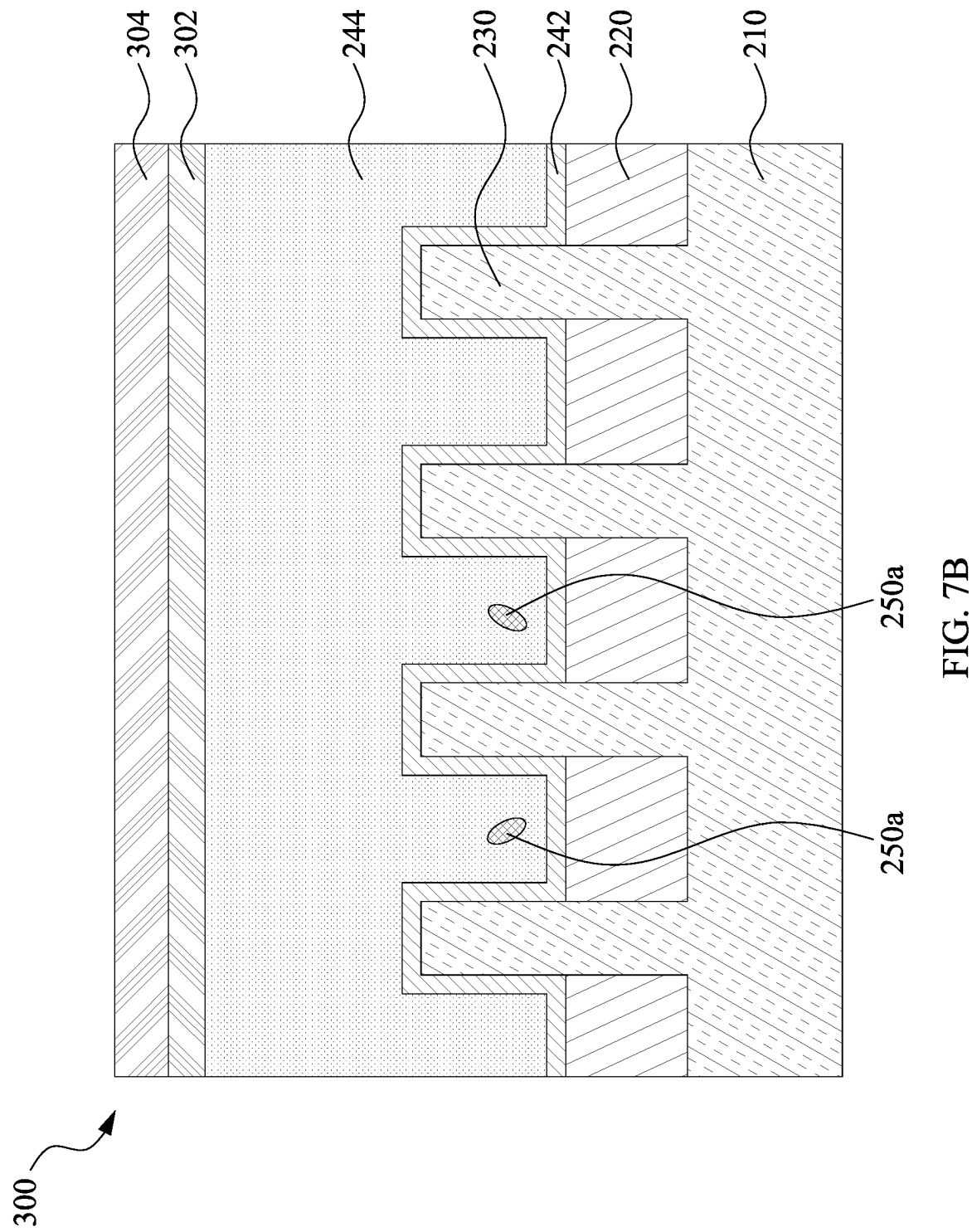

At operation 108, with reference to FIGS. 7A and 7B, the sacrificial fill layer 250 is removed by, for example, an etch process. The etch process may be any acceptable etch process, such as a reactive ion etch (RIE), neutral beam etch (NBE), the like, or a combination thereof, but the disclosures are not limited thereto.

After the etch process, the fill materials 250a filled in the voids 404 are retained. In some embodiments, the fill materials 250b filled in the recesses 402 are also left. In some embodiments, remaining fill materials 250c may be retained at bottom edges between the isolation regions 220 and the dielectric layer 242, so the remaining fill materials 250' abut the isolation regions 220 and the dielectric layer 242 and may also abut the semiconductor layer 244. In one embodiment, the remaining till materials 250c may continuously extend along a bottom edge between the isolation regions 220 and the dielectric layer 242. In another embodiment, the remaining fill materials 250c may discontinuously extend along a bottom edge between the isolation regions 220 and the dielectric layer 242.

Figure 8B:
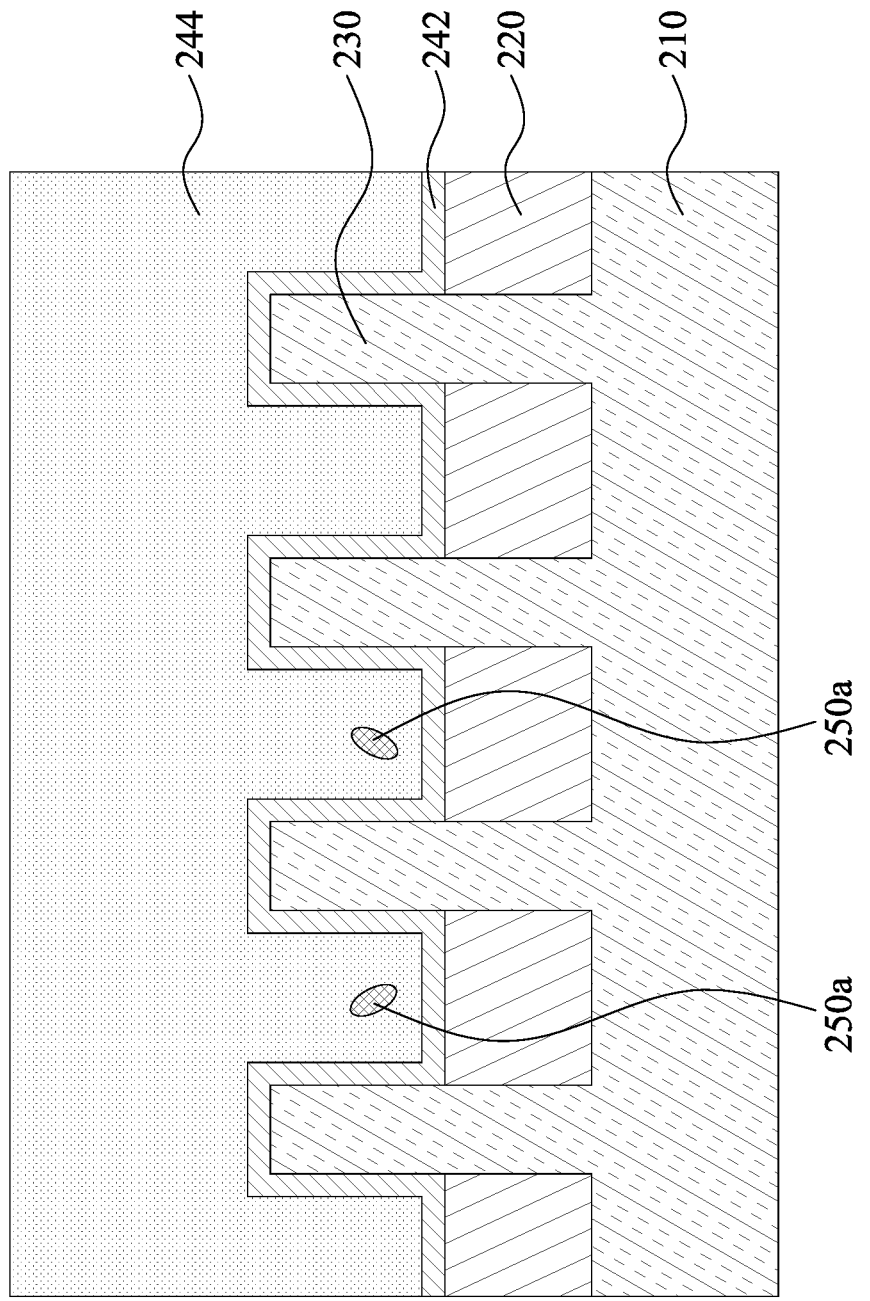

In FIGS. 8A and 8B and at operation 110, sidewall spacers 260 are formed over the sacrificial gate stacks 240. In some embodiments, the sidewall spacers 260 are formed over the top of the second mask layer 304, along sides of the second mask layer 304, the first mask layer 302 and the sacrificial gate stacks 240 and on the exposed isolation regions 220. Typical formation methods for the sidewall spacers 260 include depositing a dielectric material over the sacrificial fill layer 250 by, for example, PVD, CVD or ALD, and then anisotropically etching back the dielectric material. Then, the sidewall spacers 260 are partially removed, such as by etching, so as to be retained besides the sacrificial gate stacks 240. The etching back process may include a multiple-step etching to gain etch selectivity, flexibility and desired overetch control. The first mask layer 302 and the second mask layer 304 are also removed by any suitable cleaning step, such as ashing, stripping, or other suitable technique when or after the sidewall spacers 260 are partially removed.

The sidewall spacers 260 may at least partially cover the remaining fill materials 250c retained at bottom edges between the isolation regions 220 and the dielectric layer 242 as mentioned above. In some embodiments, the sidewall spacers 260 may completely cover the remaining fill materials 250c. The sidewall spacers 260 may include a dielectric material different from the fill materials for the sacrificial fill layer 250, including, but not limited to, silicon oxide, silicon nitride, silicon oxynitride, or combinations thereof. In an embodiment, the sidewall spacers 260 may be a multilayer structure. The sidewall spacers 260 may have a thickness in a range from few angstroms to few nanometers. In some embodiments, the sidewall spacer 260 has a thickness in a range from about 1.0 Å to about 20 nm. In some embodiments, the sidewall spacer 260 has a thickness in a range from about 1.0 Å to about 5 nm. In some embodiments, the sidewall spacer 260 has a thickness in a range from about 1.0 Å to about 30 Å.

Figure 9A:
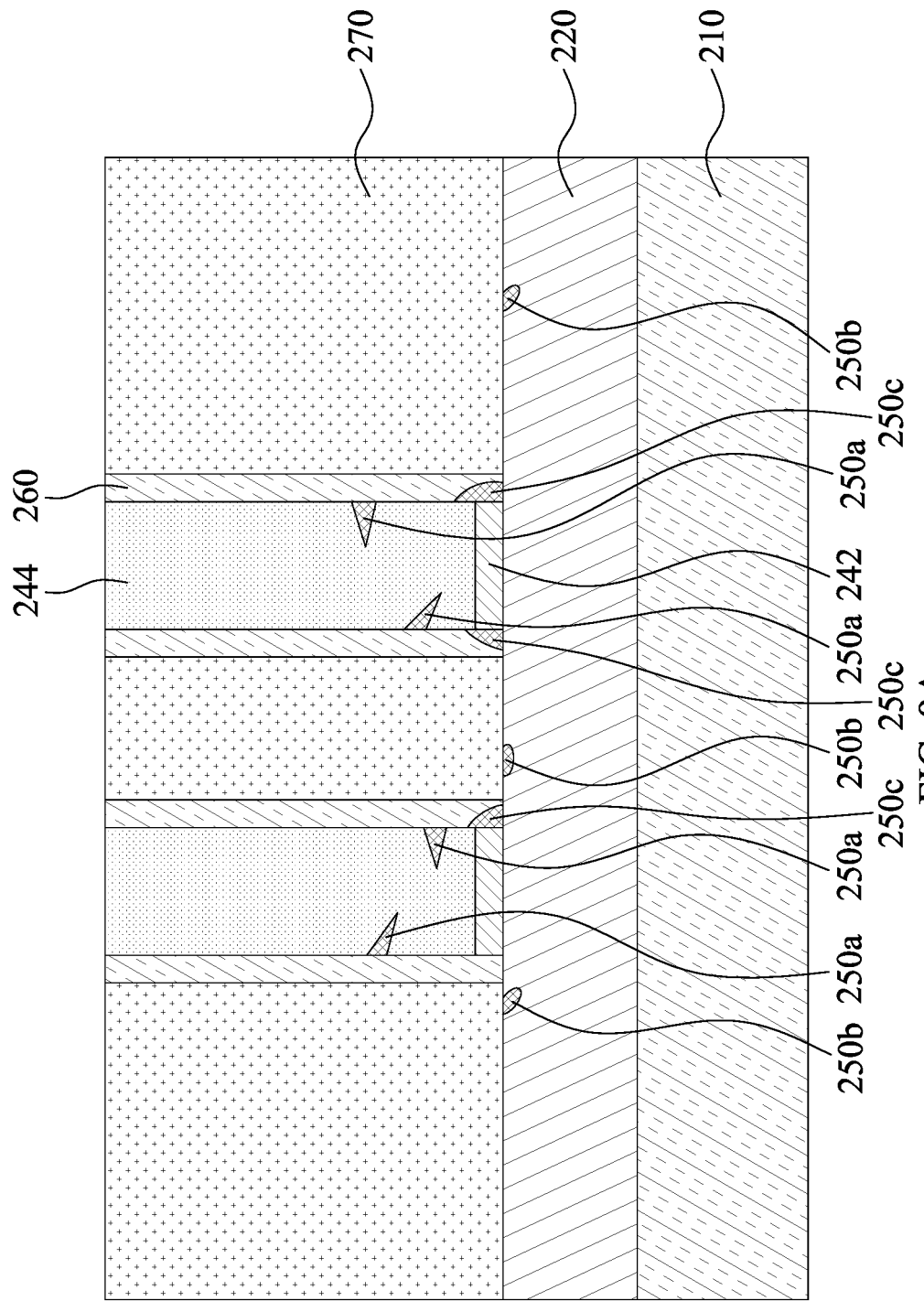
Figure 9B:
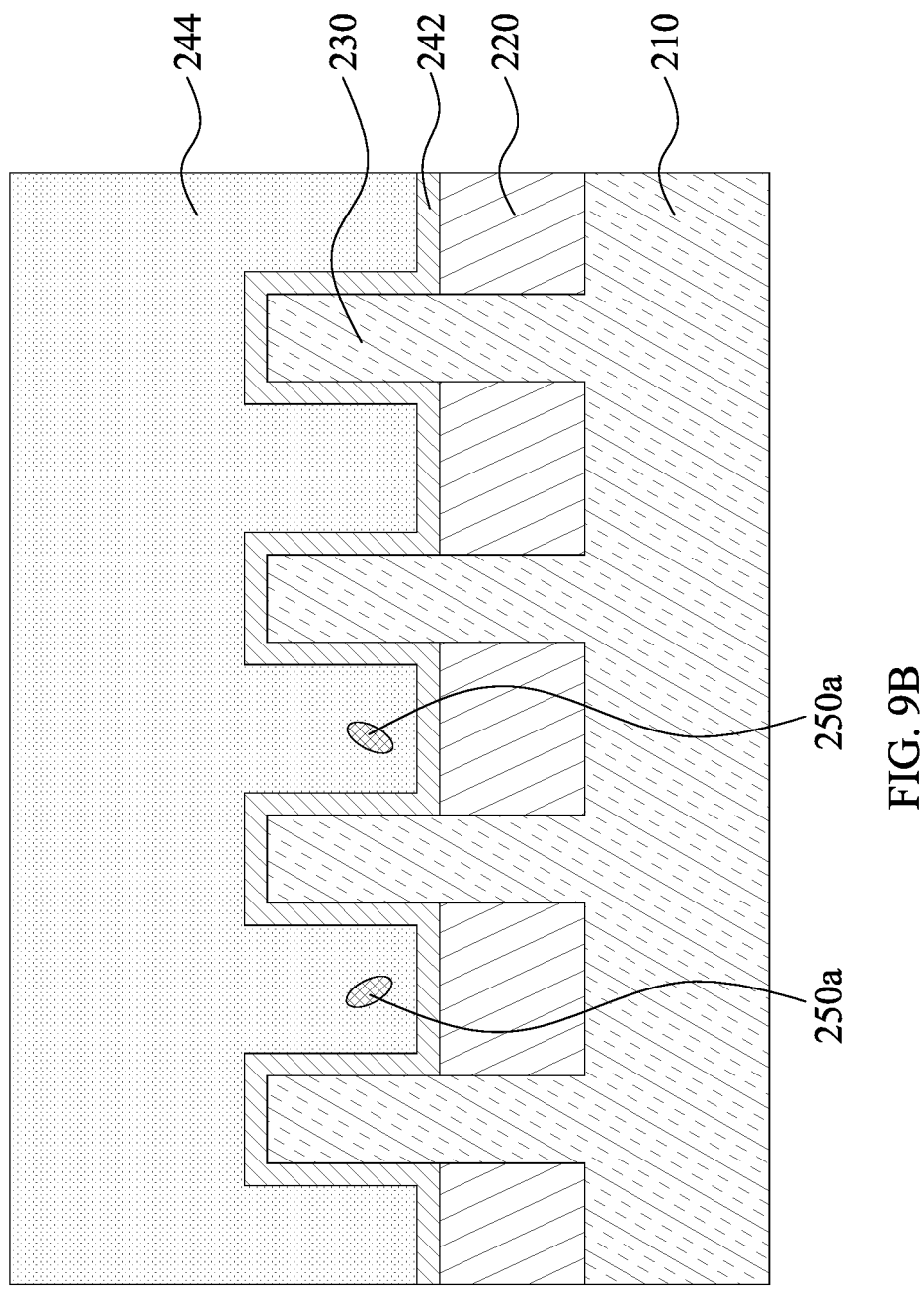

Referring to FIGS. 9A and 9B, an interlayer dielectric (ILD) layer 270 may be also formed on the isolation regions 220 and between the sacrificial gate stacks 240 sandwiched by sidewall spacers 260, so the fill materials 250b filled in the recesses 402 formed in the surface of the isolation regions 220, as mentioned above, are overlaid with the ILD layer 270. The layer 270 includes silicon oxide, oxynitride or other suitable materials. The ILD layer 270 includes a single layer or multiple layers. The ILD layer 270 is formed by a suitable technique, such as CVD, ALD and the like. A chemical mechanical polishing (CMP) process may be performed to remove excessive layer 270 and planarize the top surface of the ILD layer 270 with the top surface of the sacrificial gate stacks 240.

Figure 10A:
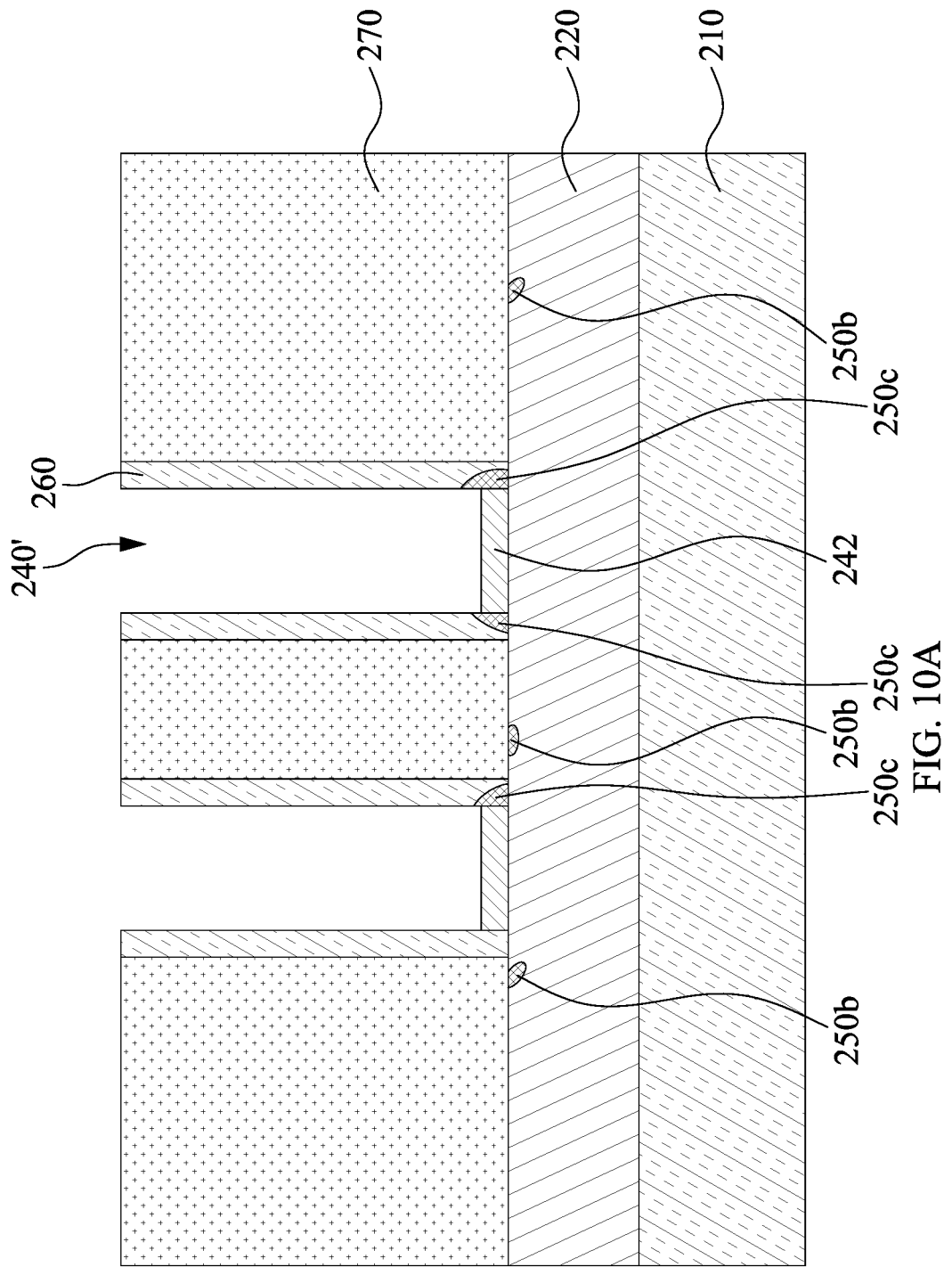
Figure 10B:
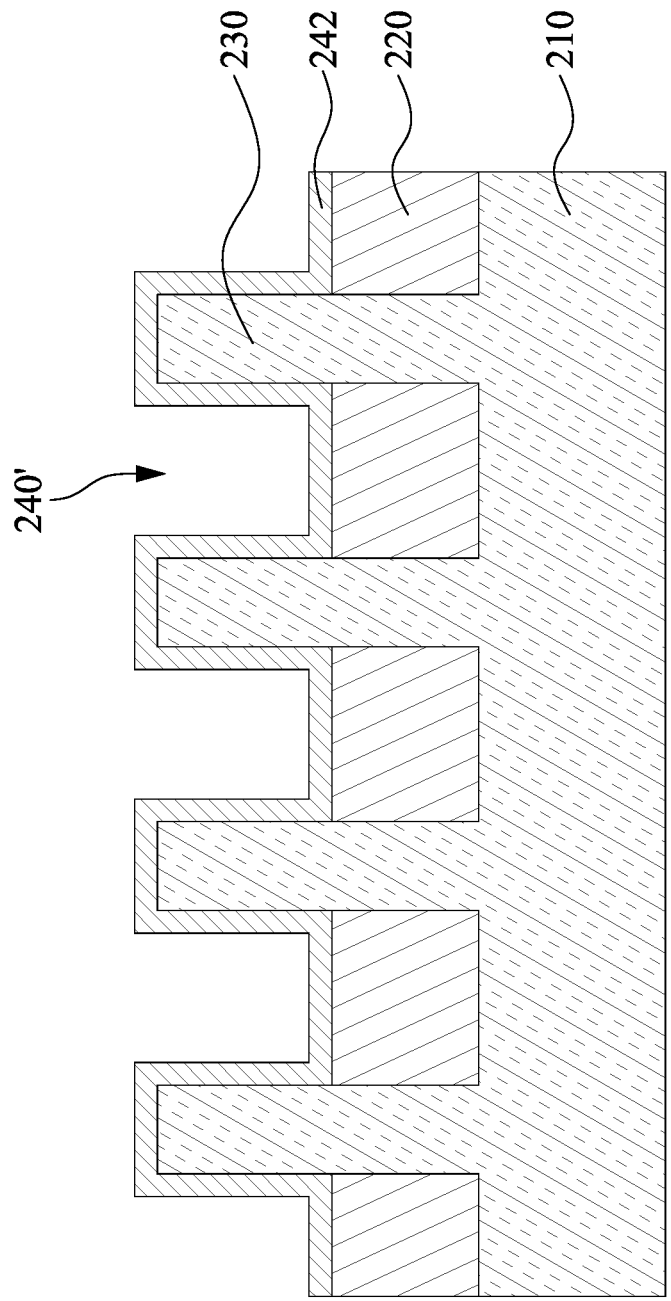

As shown in FIGS. 10A and 10B, the method 100 proceeds to operation 112 by removing the sacrificial gate stacks 240 to expose the gate channel region 240' for receiving the metal gate. The sacrificial gate stacks 240 may be removed by lithography pattern and etch processes. Alternatively, the sacrificial gate stacks 240 may be removed by a selective wet etch or a selective dry etch. In an embodiment, the wet etch operation for the sacrificial gate stacks 240 includes exposure to a hydroxide containing solution (e.g., ammonium hydroxide), deionized water, or other suitable etchant solutions. In some embodiments, as shown in FIG. 10A, during the removal of the sacrificial gate stacks 240, only the semiconductor layer 244 is removed while the dielectric layer 242 is retained. In the present invention, the fill materials 250a filled in the voids 404 can be removed during the removal of the sacrificial gate stacks 240 and thus the following formation of the metal gate will proceed smoothly so as to improve yield of the semiconductor structure.

Figure 11A:
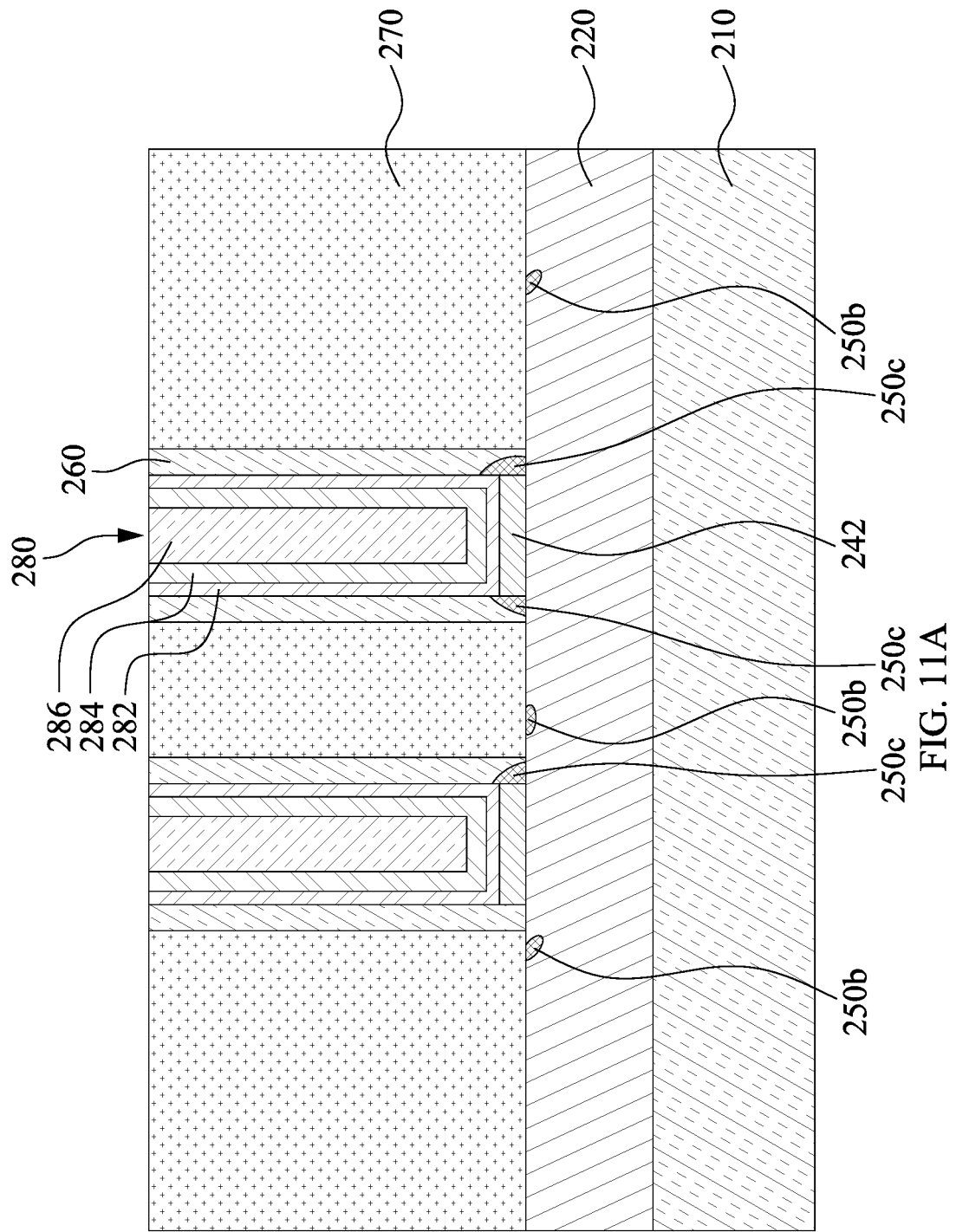
Figure 11B:
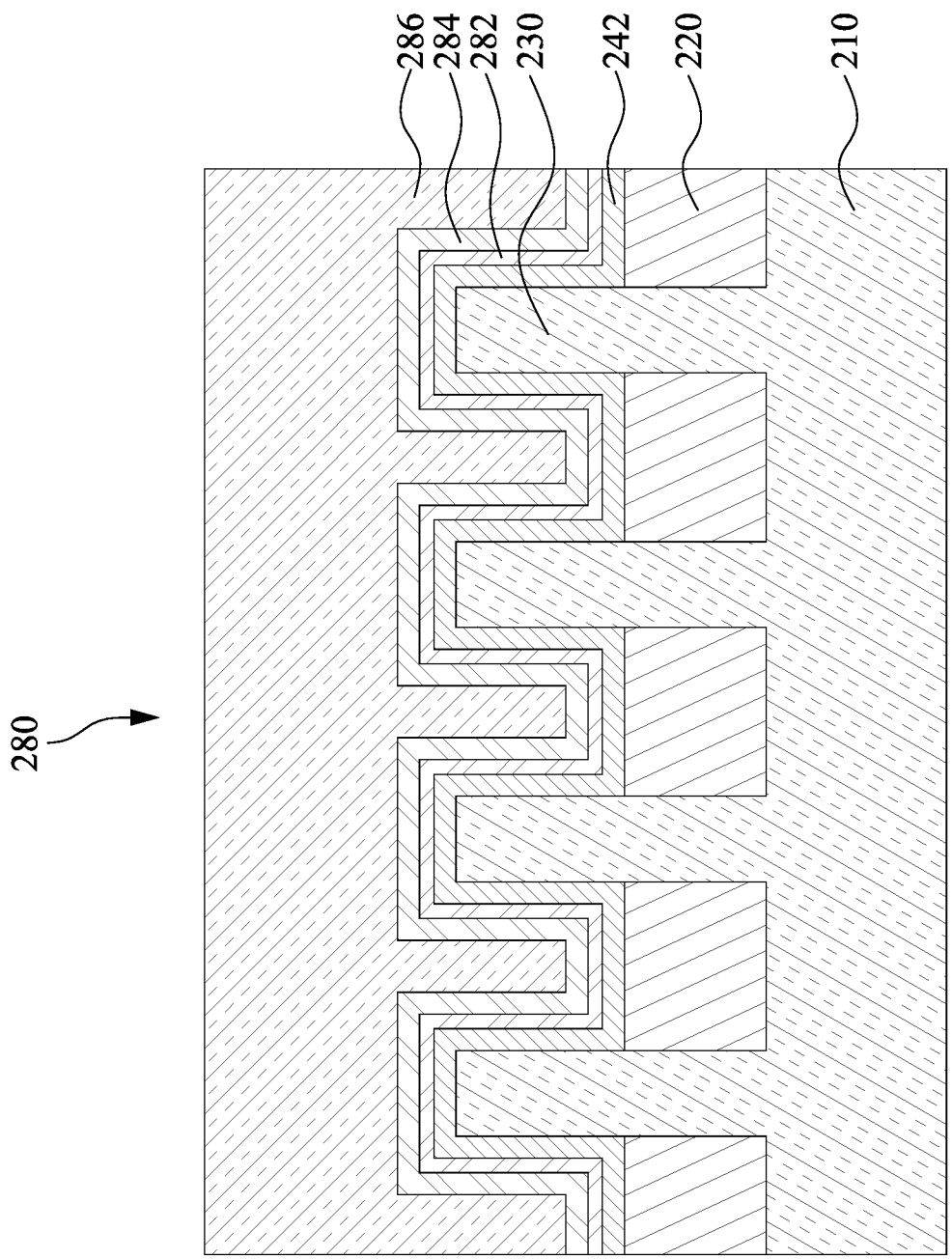

Referring to FIGS. 11A and 11B, method 100 proceeds to operation 114 by forming metal gate stacks 280, comprising a metal gate electrode adjacent to the fin features 230 with a gate dielectric layer 282 interposed therebetween, so the method further includes forming a gate dielectric layer 282 and forming a metal gate electrode. The metal gate stacks 280 are deposited conformally in gate channel region 240', such as on the top surfaces and the sidewalls of the fin features 230 and on sidewalls of the sidewall spacers 260. In some embodiments, the gate dielectric layer 282 includes a high-k dielectric material having a high dielectric constant, for example, greater than that of thermal silicon oxide (approximately 3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), oxynitride (HfOxNy), other suitable metal-oxides, or combinations thereof.

The metal gate electrode may be formed over the gate dielectric layer 282, In some embodiments, the metal gate electrode can include a work functional metal layer 284 and a metal filling layer 286. The work function layer 284 is used to provide the desired work function for transistors to enhance device performance including improved threshold voltage. In the embodiments of forming an NMOS transistor, the work function layer 284 can be an n-type metal layer. The n-type metal layer is capable of providing a work function value that is suitable for the device, such as equal to or less than about 4.5 eV. On the other hand, in the embodiments of forming a PMOS transistor, the work function layer 284 can be a p-type metal layer. The p-type metal layer is capable of providing a work function value that is suitable for the device, such as equal to or greater than about 4.8 eV. The work function metal layer 284 can include a single layer of TiN, TaN, TaAlC, TiC, TaC, Co, Al, TiAl, TiSi, TaSi or TiAlC, or a multilayer of two or more of these materials, but not limited to this. For the n-type FET, one or more of TaN, TaAlC, TiN, TiC, Co, TiAl, HfTi, TiSi and TaSi is used as the work function metal layer 284, and for the p-type FET, one or more of TiAlC, Al, TiAl, TaN, TaAlC, TiN, TiC and Co is used as the work function metal layer 284.

The metal filling layer 286 is deposited over the work function metal layer 284 to fill the gate channel region 240'. In some embodiments, the metal filling layer 286 can include conductive material such as Al, Cu, AlCu, W, Co or a combination thereof, but not limited to the above-mentioned materials. In some embodiments, the metal filling layer 286 may be deposited using a PVD process, a CVD process, an electroplating process, an electroless plating process, another applicable process, or a combination thereof.

At least one barrier layer (not shown) may be formed between the gate dielectric layer 282 and the work functional metal layer 284. The barrier layer may be used to protect the gate dielectric layer 282 from metal impurities introduced in later steps. For example, in some embodiments, the barrier layer can help to block diffusion of metal materials from those work function metal layers 284 into the gate dielectric layer 282, causing manufacturing defects. In various embodiments, the barrier layer includes a metal element. In some embodiments, the barrier layer includes tantalum nitride. In another embodiment, the barrier layer includes titanium nitride. In yet another embodiment, the barrier layer includes niobium nitride. Various other materials are suitable. In some embodiments, the barrier layer may be formed by ALD, PVD, CVD, or other suitable methods. In the present embodiment, the barrier layer has a thickness about 5 Å to about 20 Å.

Figure 12:
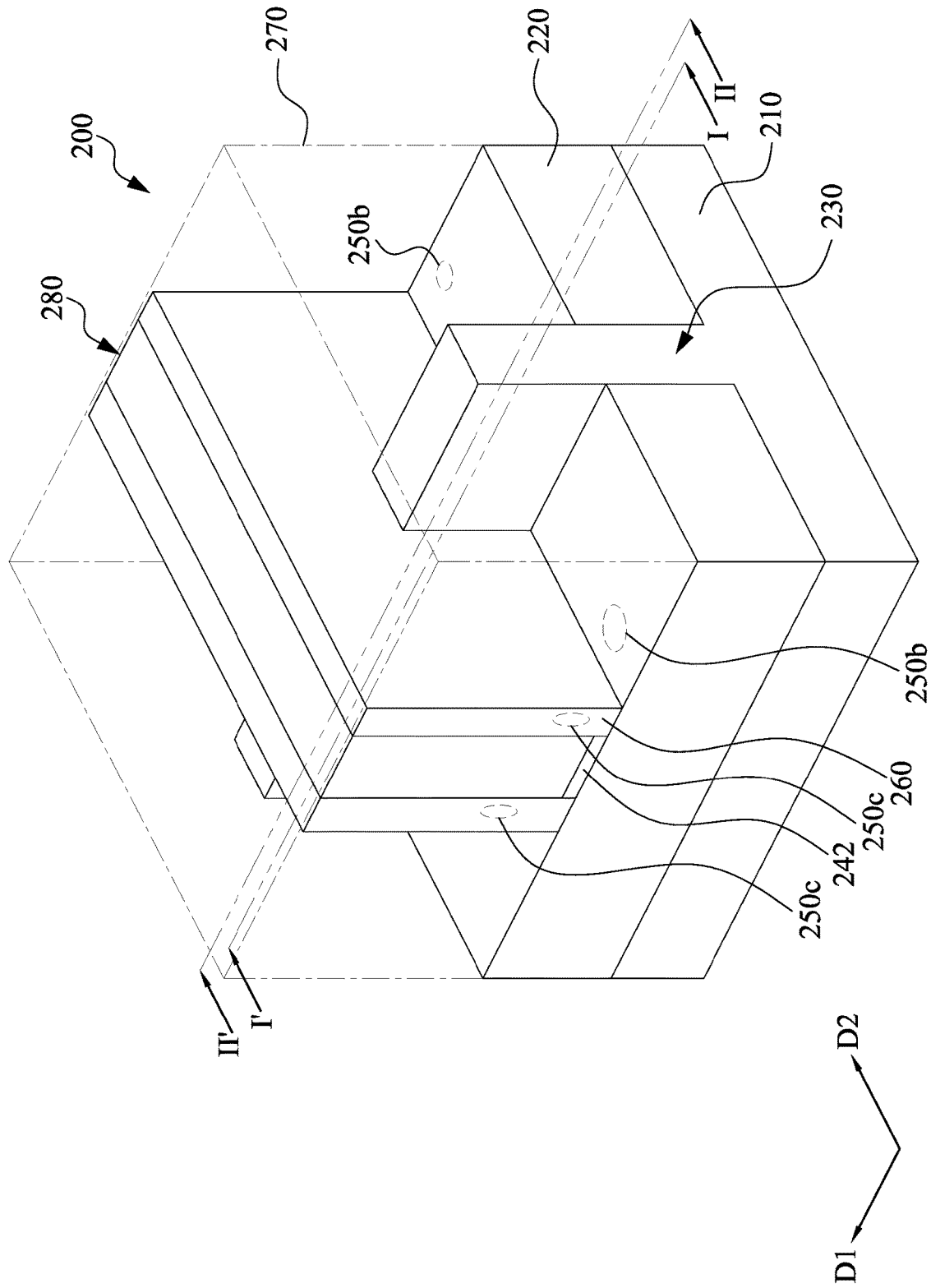
FIG. 12 is a perspective view of the semiconductor structure with metal gate stacks according to various aspects of the present disclosure.
Figure 13:
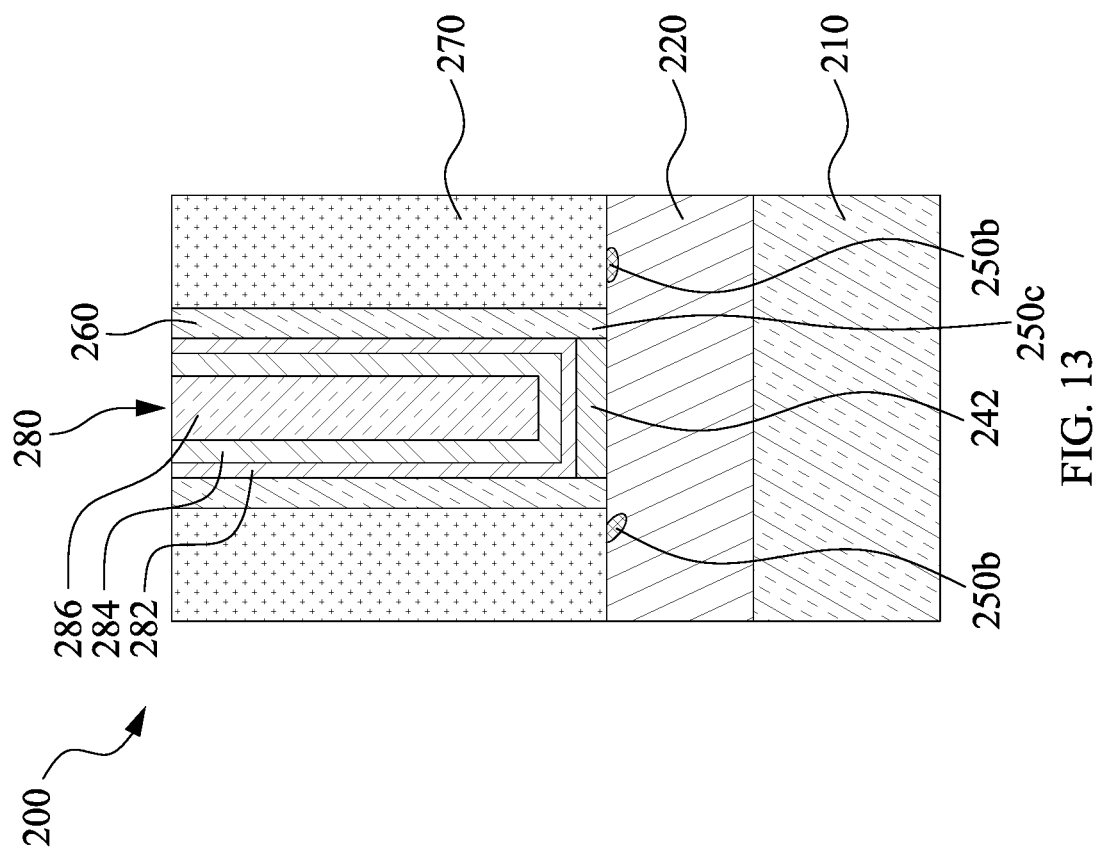
FIG. 13 is a cross-sectional view of the semiconductor structure along line I-I' in FIG. 12.

The resulting semiconductor structure 200 with the metal gate stacks 280, as shown in FIG. 12, the semiconductor structure 200 includes a substrate 210 with fin features 230, isolation regions 220, metal gate stacks 280, sidewall spacers 260 and an interlayer dielectric (ILD) layer 270. The fin features 230 extrude from the substrate 210 along a first direction D1 The isolation regions 220 are formed on the substrate 210 and sandwiched by the fin features 230. In some embodiments, the isolation regions 220 are sandwiched by lower portions of the fin features 230, so the upper portions of the fin features 230 protrude from the isolation regions 220. The metal gate stacks 280 extend along a second direction D2 different from the first direction 131. The first direction D1 and the second direction D2 are in the same horizontal plane and the first direction D1 may be perpendicular to the second direction D2. The metal gate stacks 280 may be formed over the substrate 210 with an interposed dielectric layer 242. The sidewall spacers 260 also extend along the second direction D2 and are formed besides the metal gate stacks 280. A metal gate stack 280 is sandwiched by two of the sidewall spacers 260. The ILD layer 270 is formed on the isolation regions 220 and between the metal gate stacks 280 sandwiched by sidewall spacers 260.

As shown in FIGS. 13 and 14, the metal gate stacks 280 comprise a gate dielectric layer 282, a work function layer 284 and a metal filling layer 286. The gate dielectric layer 282 is formed on the dielectric layer 242 and besides the sidewall spacers 260. The work function layer 284 is formed over the gate dielectric layer 282. The metal filling layer 286 is formed over the work function layer 284. Additional barrier layer (not shown) may be interposed between the gate dielectric layer 282 and the work function layer 284.

With reference to FIGS. 12 and 13, the isolation regions 220 have at least one recess 402 in the surface of the isolation regions 220. The recess 402 is filled with fill materials 250b, which have high etch rate selectivity to materials of the sidewall spacers 260. The fill materials 250b filled in the recess 402 formed in the surface of the isolation regions 220 are overlaid with the ILD layer 270.

With reference to FIGS. 12 and 14, the semiconductor structure 200 may comprise fill materials 250c at bottom edges between the isolation regions 220 and the dielectric layer 242, which are at least partially overlaid with the sidewall spacers 260. In some embodiments, the fill materials 250c may be completely overlaid with sidewall spacers 260. In some embodiments, when the fill materials 250c protrude out of the sidewall spacers 260, they are overlaid with the ILD layer 270.

The fill materials 250b and 250c may include, but not limited to, silicon (Si), silicon germanium (SiGe), silicon carbide (SiC), carbon, metallic compounds, high-k dielectric material, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium acuminate, zirconium oxide, titanium oxide, aluminum oxide, hafnium dioxide-alumina ($HfO_2$—$Al_2O_3$) alloy, other suitable high-k dielectric materials, or combinations thereof.

Examples of devices that can benefit from one or more embodiments of the present invention are semiconductor devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

In the present disclosure, a method of manufacturing a semiconductor structure is disclosed. The method includes receiving a substrate with fin features; forming a first gate stack over the substrate, wherein the first gate stack comprise at least one void exposed from a surface of the first gate stack; forming a fill material in the at least one void; partially removing the fill material outside the at least one void, wherein a portion of the fill material is left in the at least one void; forming sidewall spacers besides the first gate stack; removing the first gate stack; and forming a second gate stack.

In some embodiments, the method includes receiving a substrate comprising fin features extending along a first direction; forming replacement gate stacks along a second direction different from the first direction over the substrate; forming a dielectric material over the replacement gate stacks; partially removing the dielectric material, wherein a first portion of first dielectric material is left on the replacement gate stacks; depositing sidewall spacers over the first portion of the dielectric material and the replacement gate stacks; removing the replacement gate stacks; and forming metal gate stacks in place of the replacement gate stacks.

In some embodiments, the method includes receiving a substrate comprising fin features extending along a first direction; forming isolation regions between the fin features over the substrate, wherein at least one recess is formed on a surface of the isolation regions; forming replacement gate stacks over the substrate; forming a dielectric material over the replacement gate stacks, wherein the dielectric material overlays the isolation regions and covers the at least one recess; thinning the dielectric material, wherein a portion of the thinned dielectric material is coplanar with the surface of the isolation regions; depositing sidewall spacers on sidewalls of the replacement gate stacks; removing the replacement gate stacks; and forming metal gate stacks extending along a second direction different from the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a substrate with fin features;
   forming a first gate stack over the substrate, wherein the first gate stack comprises at least one void exposed from a surface of the first gate stack;
   forming a fill material in the at least one void;
   partially removing the fill material outside the at least one void, wherein a portion of the fill material is left in the at least one void;
   forming sidewall spacers besides the first gate stack;
   removing the first gate stack; and
   forming a second gate stack.

2. The method of claim 1, wherein the portion of the fill material filled in the at least one void is level with sidewalls of the first gate stack after partially removing the fill material.

3. The method of claim 1, wherein the portion of the fill material filled in the at least one void is removed along with the removing of the first gate stack.

4. The method of claim 1, wherein the first gate stack comprise a dielectric layer formed over the substrate and a semiconductor layer formed on the dielectric layer, and wherein the at least one void is formed in a bottom region of the semiconductor layer, which is below about 60% of a thickness of the semiconductor layer.

5. The method of claim 1, wherein the substrate comprises isolation regions between the fin features; and the isolation regions have at least one recess formed in a surface of the isolation regions, wherein the at least one recess is filled with the fill material during the forming of the fill material.

6. The method of claim 5, further comprising forming an interlayer dielectric (ILD) layer on the isolation regions and between the first gate stack after forming the sidewall spacers, wherein the fill material filled in the at least one recess is overlaid with the ILD layer.

7. The method of claim 1, wherein the substrate comprises isolation regions between the fin features; and wherein after removing the fill material, at least one portion of the fill material is retained at bottom edges of the first gate stack between the isolation regions and the first gate stack.

8. The method of claim 7, wherein the at least one portion of the fill material retained at the bottom edges of the first gate stack between the isolation regions and the first gate stack are at least partially overlaid with the sidewall spacers during the forming of the sidewall spacers.

9. The method of claim 1, wherein the fill material has a thickness in a range from about 1.0 Å to about 1 nm.

10. The method of claim 1, wherein the fill material includes silicon (Si), silicon germanium (SiGe), silicon carbide (SiC), carbon, metallic compounds, a high-k dielectric material or a combination thereof.

11. The method of claim 1, wherein each of the sidewall spacers has a thickness in a range from about 1.0 Å to about 20 nm.

12. A method of manufacturing a semiconductor structure, comprising:
   receiving a substrate comprising fin features extending along a first direction;
   forming first gate stacks along a second direction different from the first direction over the substrate, wherein the first gate stacks comprise first voids exposed from a surface of the first gate stacks;
   forming a dielectric material over the first gate stack;
   partially removing the dielectric material, wherein a first portion of the dielectric material is left in the first voids;
   depositing sidewall spacers over the first portion of the dielectric material and the first gate stacks;
   removing the first gate stacks; and
   forming metal gate stacks in place of the first gate stacks.

13. The method of claim 12, wherein the substrate further comprises isolation regions between the fin features; and wherein the isolation regions comprise second voids, and the forming of the dielectric material comprises filling a second portion of the dielectric material in the second voids.

14. The method of claim 13, further comprising forming an interlayer dielectric (ILD) layer over the isolation regions and between the metal gate stacks, wherein the ILD layer contacts the second portion of the dielectric material and the isolation regions.

15. The method of claim 13, wherein the forming of the dielectric material comprises forming the first portion of the dielectric material at bottom edges of the first gate stacks.

16. The method of claim 15, wherein the depositing of the sidewall spacers comprises covering the first portion of the dielectric material at the bottom edges.

17. The method of claim 12, wherein the first portion of the dielectric material is level with sidewalls of the first gate stacks after the partially removing of the dielectric material.

18. A method of manufacturing a semiconductor structure, comprising:
   receiving a substrate comprising fin features extending along a first direction;
   depositing isolation regions over the substrate adjacent to the fin features forming a first gate stack between the fin features over the substrate, wherein at least one void is formed on a surface of the first gate stack;
   forming a dielectric material over the first gate stacks, wherein the dielectric material overlays the isolation regions and covers the at least one void;
   thinning the dielectric material, wherein a portion of the thinned dielectric material fills the at least one void on the surface of the first gate stack;
   depositing sidewall spacers on sidewalls of the first gate stacks;
   removing the first gate stacks; and
   forming metal gate stacks extending along a second direction different from the first direction.

19. The method of claim 18, further comprising forming an interlayer dielectric (ILD) layer over the isolation regions and between the metal gate stacks, wherein the ILD layer contacts the portion of the thinned dielectric material.

20. The method of claim 18, wherein the dielectric material has a thickness in a range from a few angstroms to a few nanometers, a thickness in a range from about 1.0 Å to about 1 nm, a thickness in a range from about 1.0 Å to about 500 Å, or a thickness in a range from about 1.0 Å to about 50 Å.

* * * * *